US012677708B2

(12) United States Patent
Tsuboi et al.

(10) Patent No.: US 12,677,708 B2
(45) Date of Patent: Jul. 7, 2026

(54) DISPLAY MODULE, MANUFACTURING METHOD, AND DISPLAY APPARATUS

(71) Applicant: SONY GROUP CORPORATION, Tokyo (JP)

(72) Inventors: Hisanori Tsuboi, Tokyo (JP); Masanobu Kimura, Tokyo (JP); Norifumi Kikuchi, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 424 days.

(21) Appl. No.: 18/255,864

(22) PCT Filed: Nov. 26, 2021

(86) PCT No.: PCT/JP2021/043317
§ 371 (c)(1),
(2) Date: Jun. 2, 2023

(87) PCT Pub. No.: WO2022/124095
PCT Pub. Date: Jun. 16, 2022

(65) Prior Publication Data
US 2024/0105685 A1 Mar. 28, 2024

(30) Foreign Application Priority Data
Dec. 10, 2020 (JP) ................................. 2020-204777

(51) Int. Cl.
*H10W 90/00* (2026.01)
*G02B 5/30* (2006.01)
(52) U.S. Cl.
CPC ........... *H10W 90/00* (2026.01); *G02B 5/3025* (2013.01)

(58) Field of Classification Search
CPC .. H01L 25/0753; G02B 5/3025; H10H 20/85; G09F 9/00; G09F 9/33
See application file for complete search history.

(56) References Cited

U.S. PATENT DOCUMENTS

2017/0309698 A1 10/2017 Bower
2018/0031919 A1 2/2018 Ryu et al.
(Continued)

FOREIGN PATENT DOCUMENTS

CN 102842271 A 12/2012
CN 108230900 A 6/2018
(Continued)

OTHER PUBLICATIONS

International Search Report and Written Opinion of PCT Application No. PCT/JP2021/043317, issued on Jan. 11, 2022, 11 pages of ISRWO.

*Primary Examiner* — Elmito Breval
(74) *Attorney, Agent, or Firm* — CHIP LAW GROUP

(57) ABSTRACT
The present technology relates to a display module and a manufacturing method, and a display apparatus that enable visual quality to be improved. A display module includes a display section and a film disposed on the display section to reduce light incident from outside and that is reflected from the display section. The display section includes an electronic board and a plurality of LED elements juxtaposed at predetermined intervals on a surface of the electronic board, the surface being on the film side. A distance from the LED element positioned closest to an end of the display section to the end of the display section is equal to or shorter than half the predetermined interval. The present technology is applicable to a LED tiling display.

20 Claims, 19 Drawing Sheets

(56)          References Cited

U.S. PATENT DOCUMENTS

| | | |
|---|---|---|
| 2018/0190747 A1 | 7/2018 | Son |
| 2020/0058834 A1 | 2/2020 | Park et al. |
| 2020/0159054 A1 | 5/2020 | Jeong |

FOREIGN PATENT DOCUMENTS

| | | | | |
|---|---|---|---|---|
| CN | 110379322 A | 10/2019 | | |
| JP | 03-063181 U | 6/1991 | | |
| JP | 2003-262858 A | 9/2003 | | |
| JP | 2007-065523 A | 3/2007 | | |
| JP | 2011-022202 A | 2/2011 | | |
| JP | 2013-109354 A | 6/2013 | | |
| WO | WO-2018190181 A1 * | 10/2018 | .......... | G02F 1/1335 |
| WO | WO-2020166505 A1 | 8/2020 | | |

* cited by examiner

F I G . 1
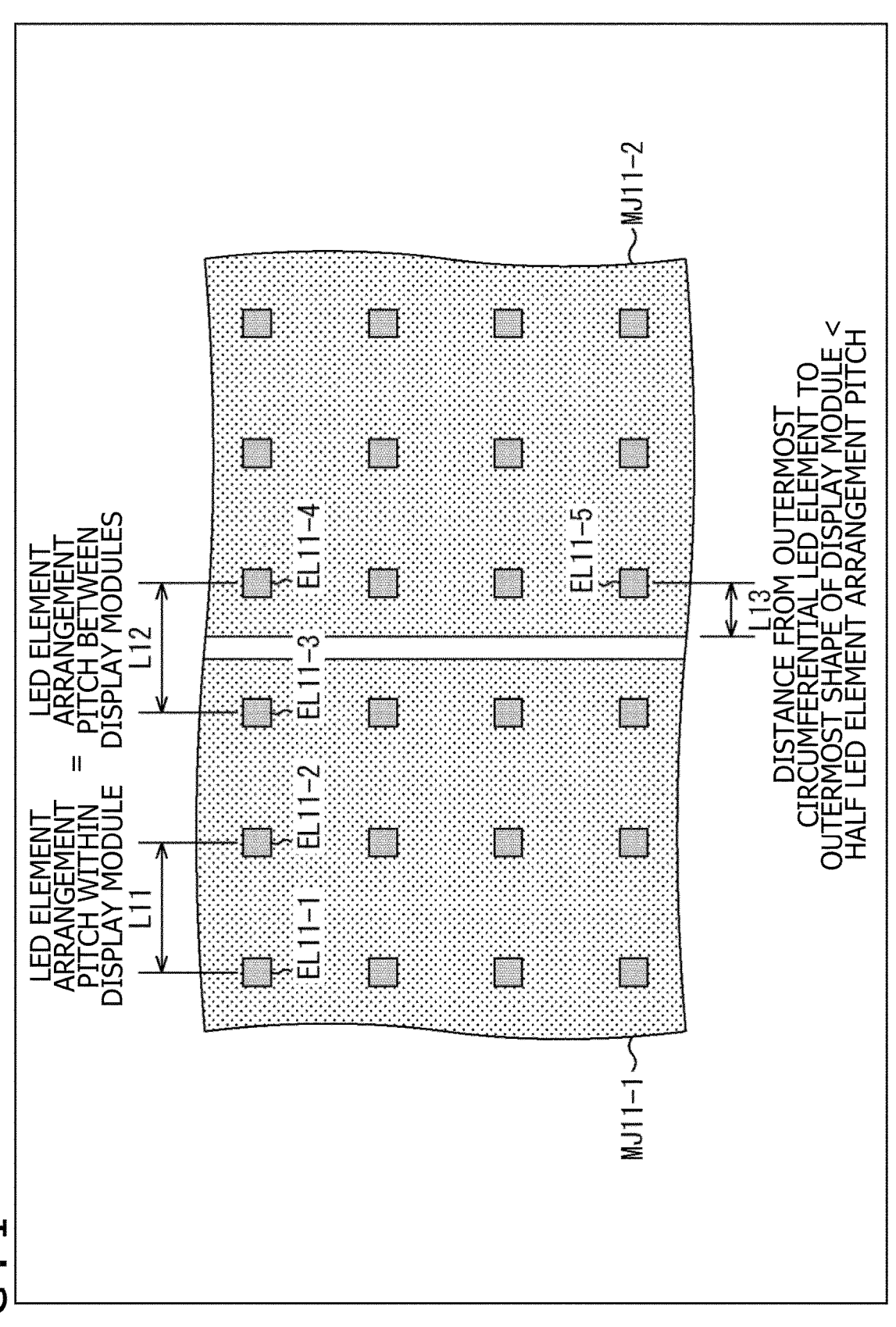

F I G . 3
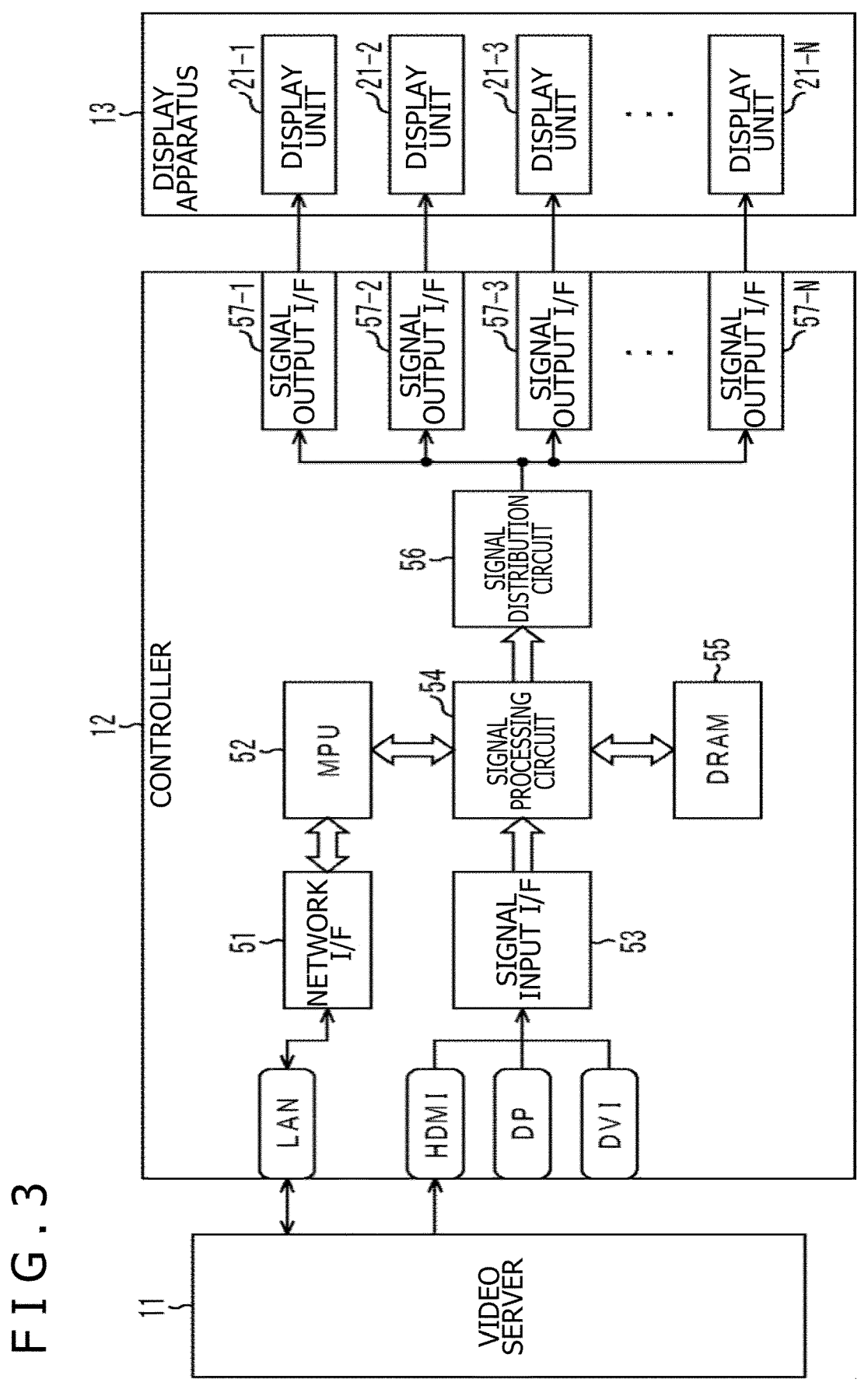

F I G . 5
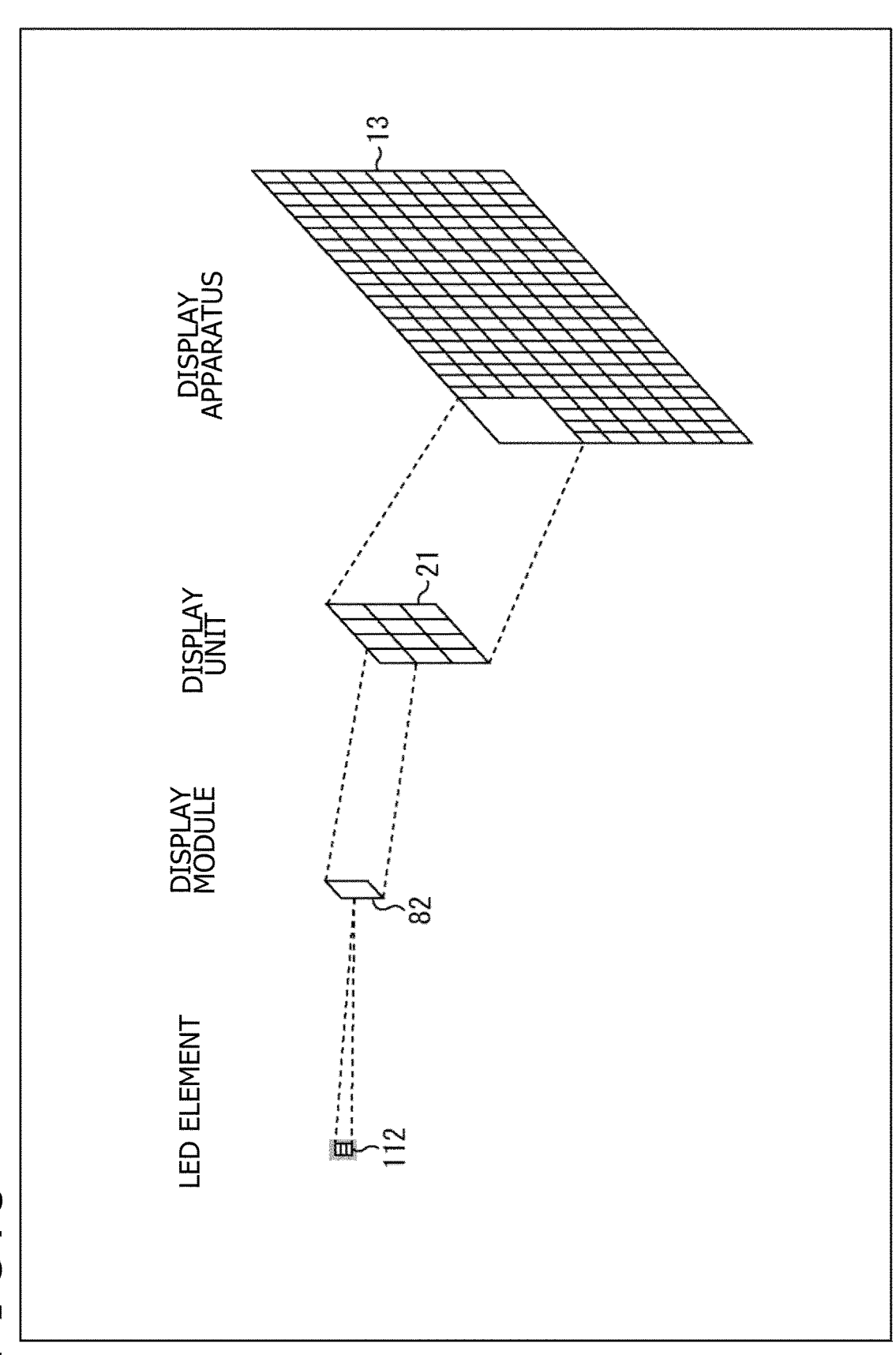

F I G . 6
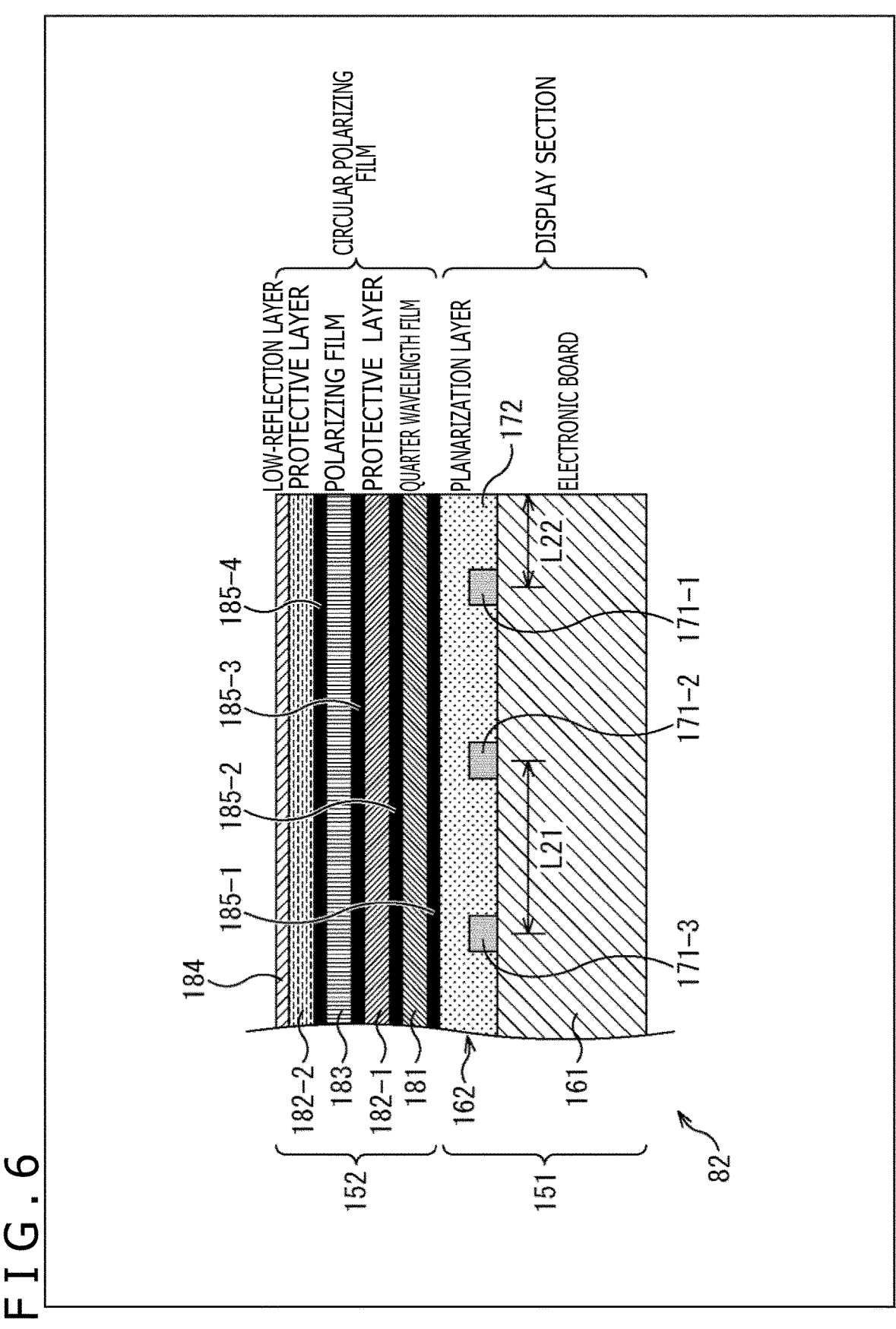

F I G . 8
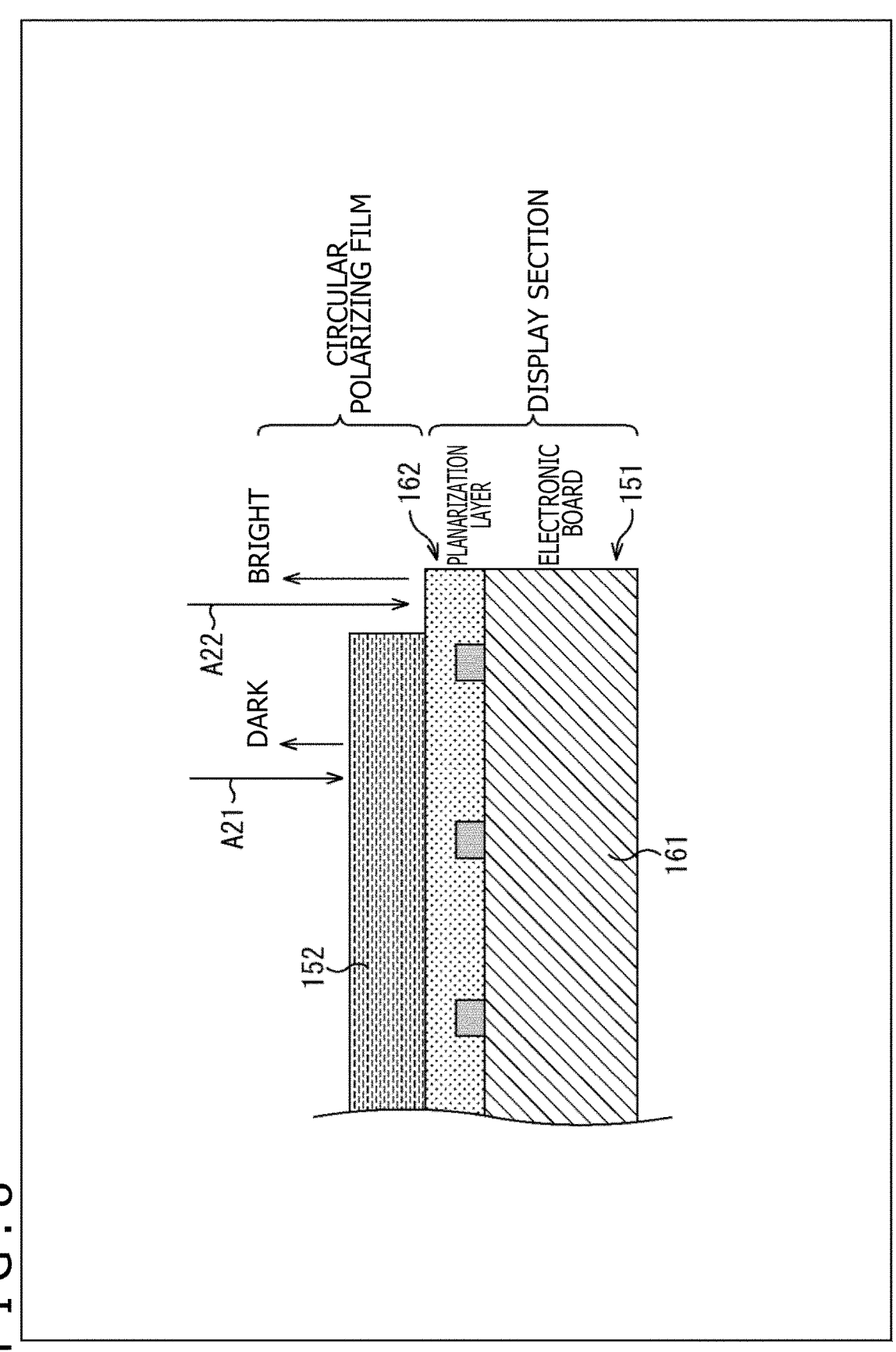

F I G . 1 1
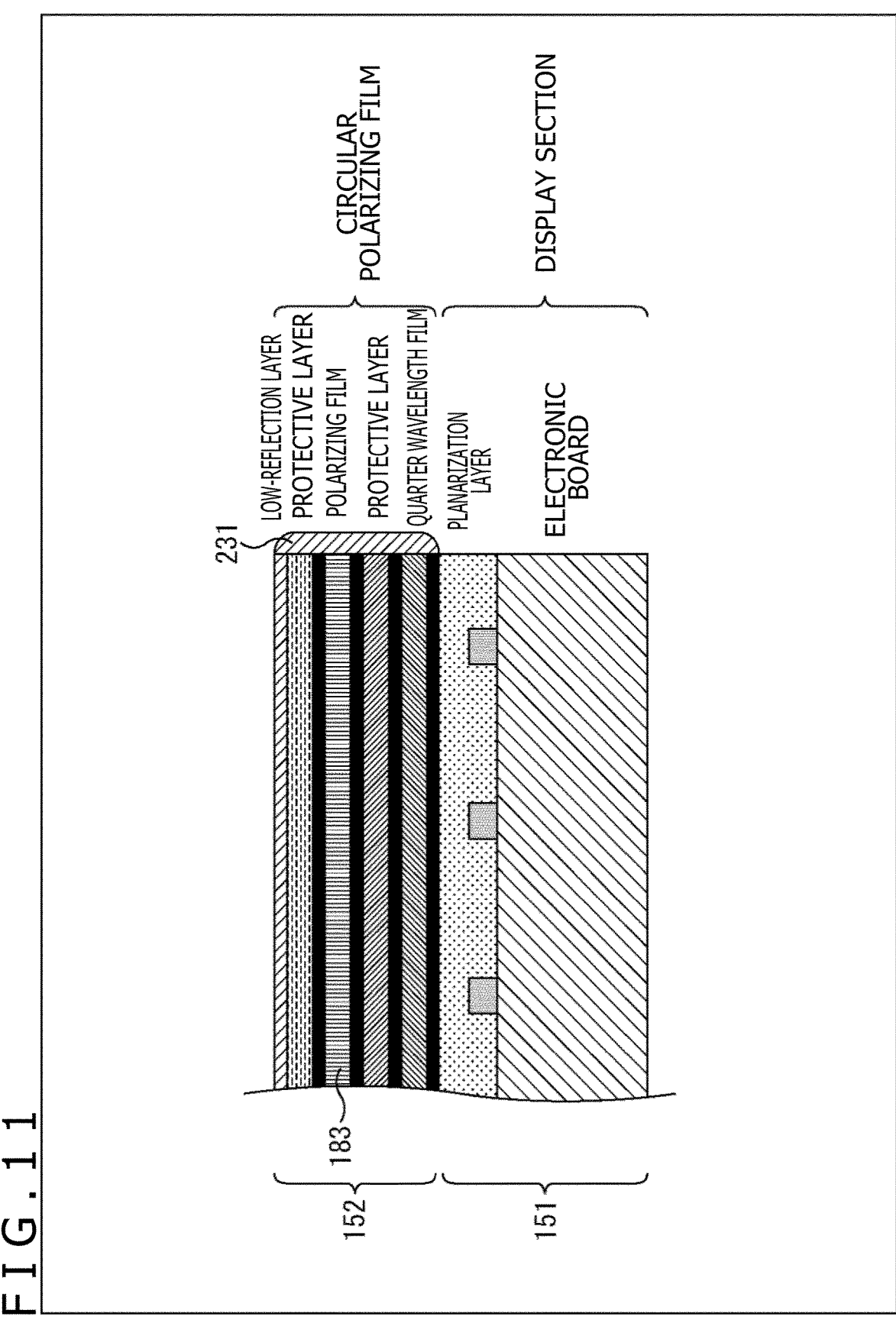

F I G . 1 2
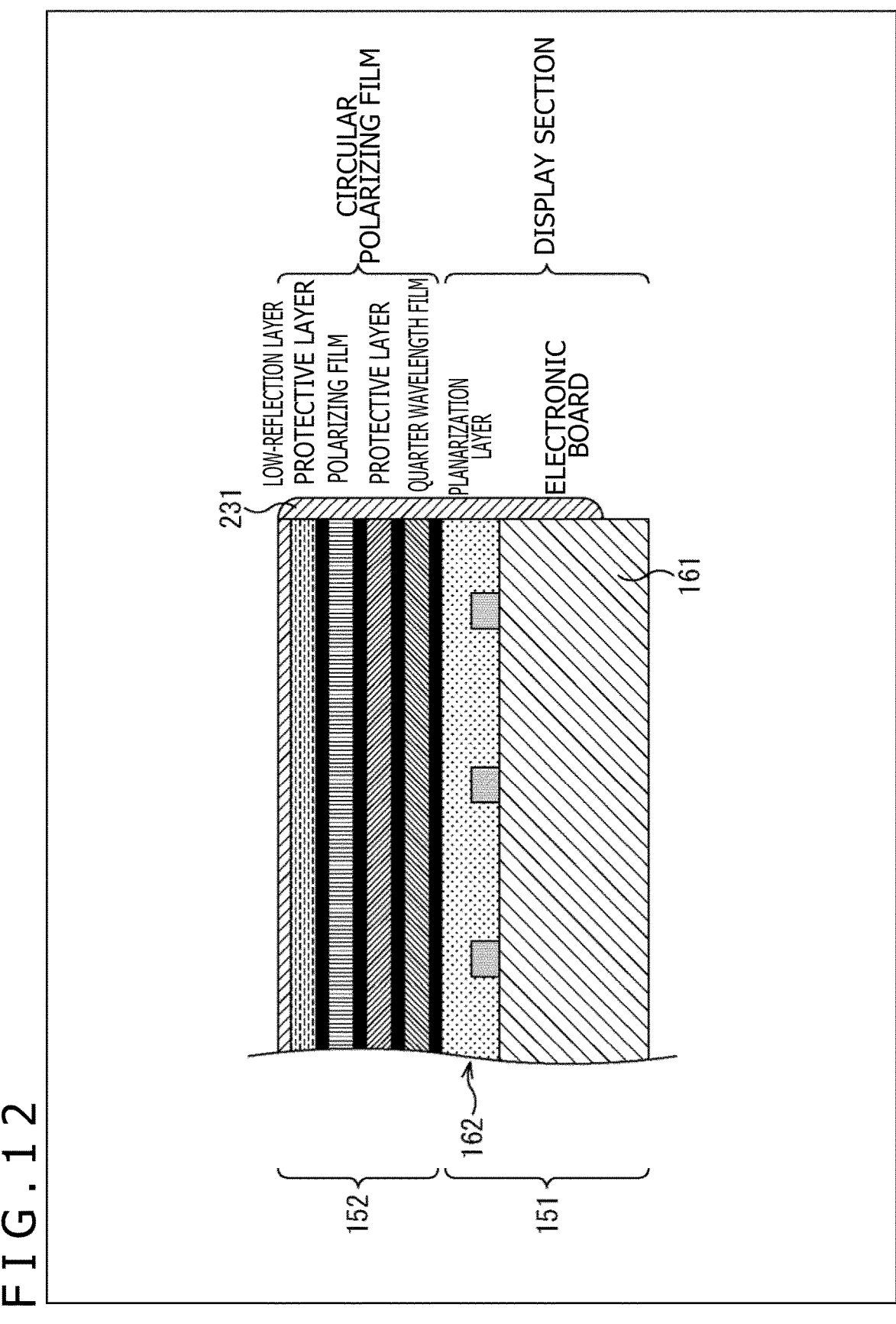

F I G . 1 3
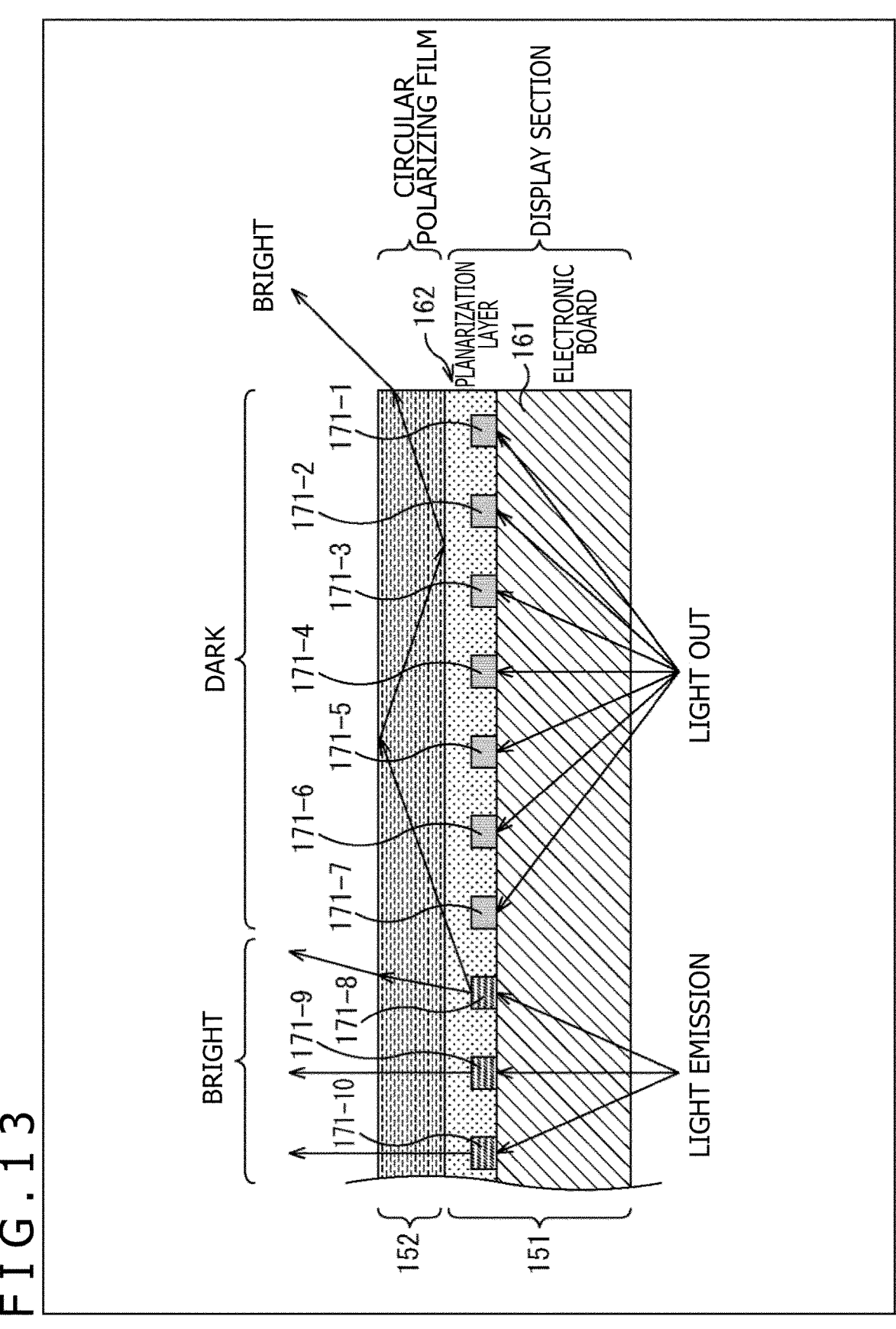

F I G . 1 5
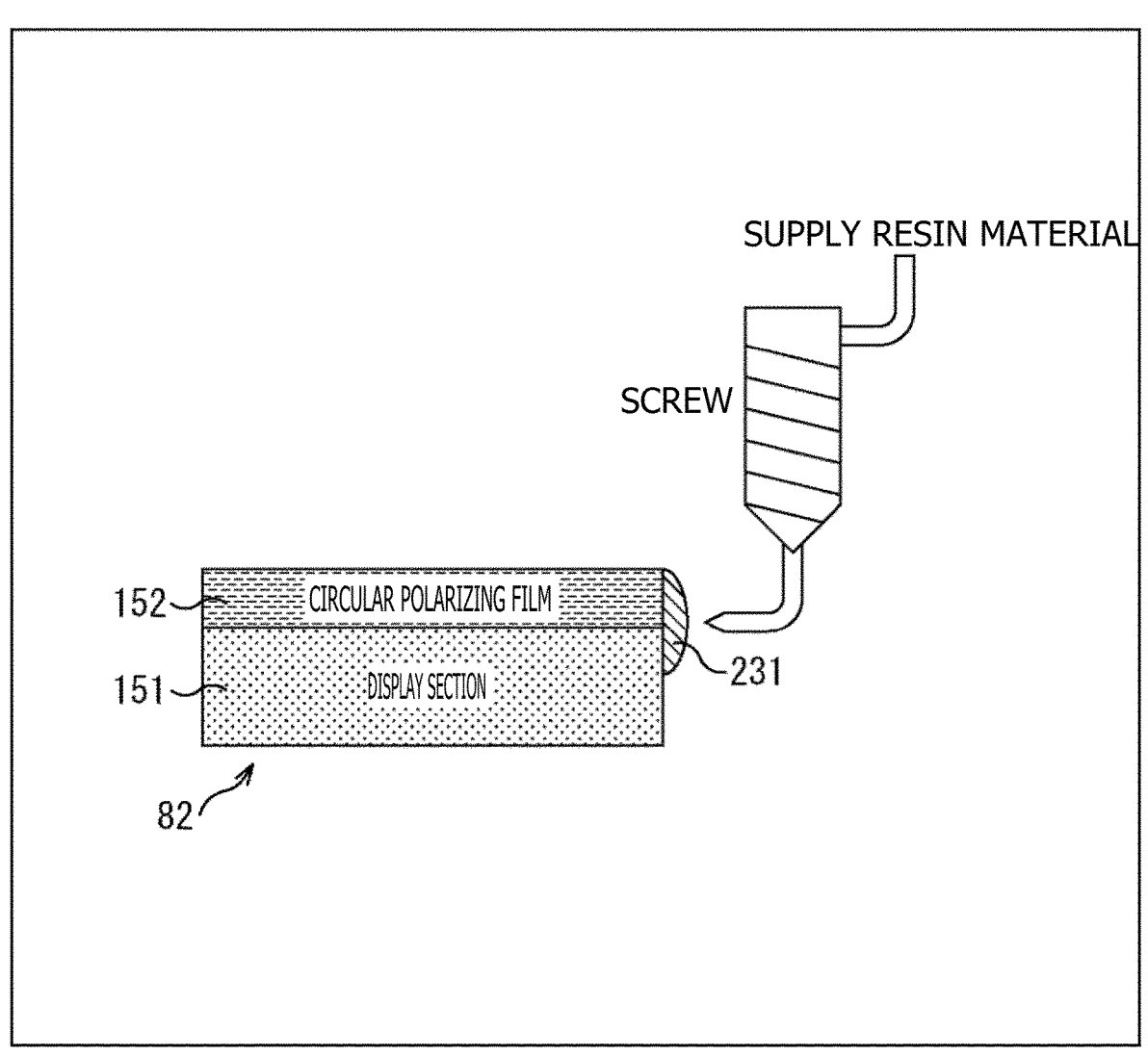

DISPLAY MODULE, MANUFACTURING METHOD, AND DISPLAY APPARATUS

TECHNICAL FIELD

The present technology relates to a display module and a manufacturing method, and a display apparatus, and in particular, to a display module and a manufacturing method, and a display apparatus that are enabled to improve visual quality.

BACKGROUND ART

In the related art, a LED (Light Emitting Diode) tiling display is known that includes an array of a plurality of panel-shaped display modules each including a plurality of LED elements mounted and aligned on an electronic board. For example, for the LED tiling display, a large display can be realized by juxtaposing a large number of display modules.

Additionally, as a technology related to displays, organic light emitting diode display apparatuses have also been proposed in which an antireflection film is provided on a front surface of a display area to suppress reflection of outside light (for example, see PTL 1).

CITATION LIST

Patent Literature

[PTL 1]
  JP 2007-65523A

SUMMARY

Technical Problem

However, the above-described LED tiling display has difficulty in suppressing reflection of outside light to display images with sufficiently high visual quality.

In view of these circumstances, the present technology allows visual quality to be improved.

Solution to Problem

A first aspect of the present technology provides a display module including a display section and a film disposed on the display section to reduce light incident from outside and that is reflected from the display section, in which the display section includes an electronic board and a plurality of LED elements juxtaposed at predetermined intervals on a surface of the electronic board, the surface being on the film side, and a distance from the LED element positioned closest to an end of the display section to the end of the display section is equal to or shorter than half the predetermined interval.

In the first aspect of the present technology, the display module is provided with the display section and the film disposed on the display section to reduce light incident from outside and that is reflected from the display section. The display section is provided with the electronic board and the plurality of LED elements juxtaposed at the predetermined intervals on the film side surface of the electronic board. Additionally, the distance from the LED element positioned closest to the end of the display section to the end of the display section is equal to or shorter than half the predetermined interval.

A second aspect of the present technology provides a display apparatus including a plurality of display modules juxtaposed like tiles, in which each of the display modules includes a display section and a film disposed on the display section to reduce light incident from outside and that is reflected from the display section, the display section includes an electronic board and a plurality of LED elements juxtaposed at predetermined intervals on a surface of the electronic board, the surface being on the film side, and a distance from the LED element positioned closest to an end of the display section to the end of the display section is equal to or shorter than half the predetermined interval.

In the second aspect of the present technology, in the display apparatus including the plurality of display modules juxtaposed like tiles, each of the display modules is provided with the display section and the film disposed on the display section to reduce light incident from outside and that is reflected from the display section. The display section is provided with the electronic board and the plurality of LED elements juxtaposed at the predetermined intervals on the film side surface of the electronic board. Additionally, the distance from the LED element positioned closest to the end of the display section to the end of the display section is equal to or shorter than half the predetermined interval.

A third aspect of the present technology provides a manufacturing method for a display module including a display section and a film disposed on the display section to reduce light incident from outside and that is reflected from the display section, the manufacturing method including the steps of juxtaposing a plurality of LED elements at predetermined intervals on an electronic board to form the display section including the electronic board and the plurality of the LED elements and in which a distance from the LED element positioned closest to an end of the display section to the end of the display section is equal to or shorter than half the predetermined interval, and disposing the film on a surface of the display section on which the LED elements are disposed.

In the third aspect of the present technology, when the display module is manufactured that includes the display section and the film disposed on the display section to reduce light incident from outside and that is reflected from the display section, the plurality of LED elements is juxtaposed at the predetermined intervals on the electronic board to form the display section including the electronic board and the plurality of the LED elements and in which the distance from the LED element positioned closest to the end of the display section to the end of the display section is equal to or shorter than half the predetermined interval, and the film is disposed on the surface of the display section on which the LED elements are disposed.

BRIEF DESCRIPTION OF DRAWINGS

FIG. 1 is a diagram illustrating arrangement of a display modules and LED elements in a LED tiling display.

FIG. 3 is a diagram depicting a configuration example of a controller.

FIG. 5 is a diagram depicting a configuration example of a display apparatus.

FIG. 6 is a diagram depicting a configuration example of the display module.

FIG. 8 is a diagram illustrating reflection of outside light from a display section.

FIG. 11 is a diagram illustrating application of the resin material.

FIG. 12 is a diagram illustrating application of the resin material.

FIG. 13 is a diagram illustrating degradation of visual quality caused by light from the end of the circular polarizing film.

FIG. 15 is a diagram illustrating an application method for the resin material.

DESCRIPTION OF EMBODIMENTS

Figure 2:
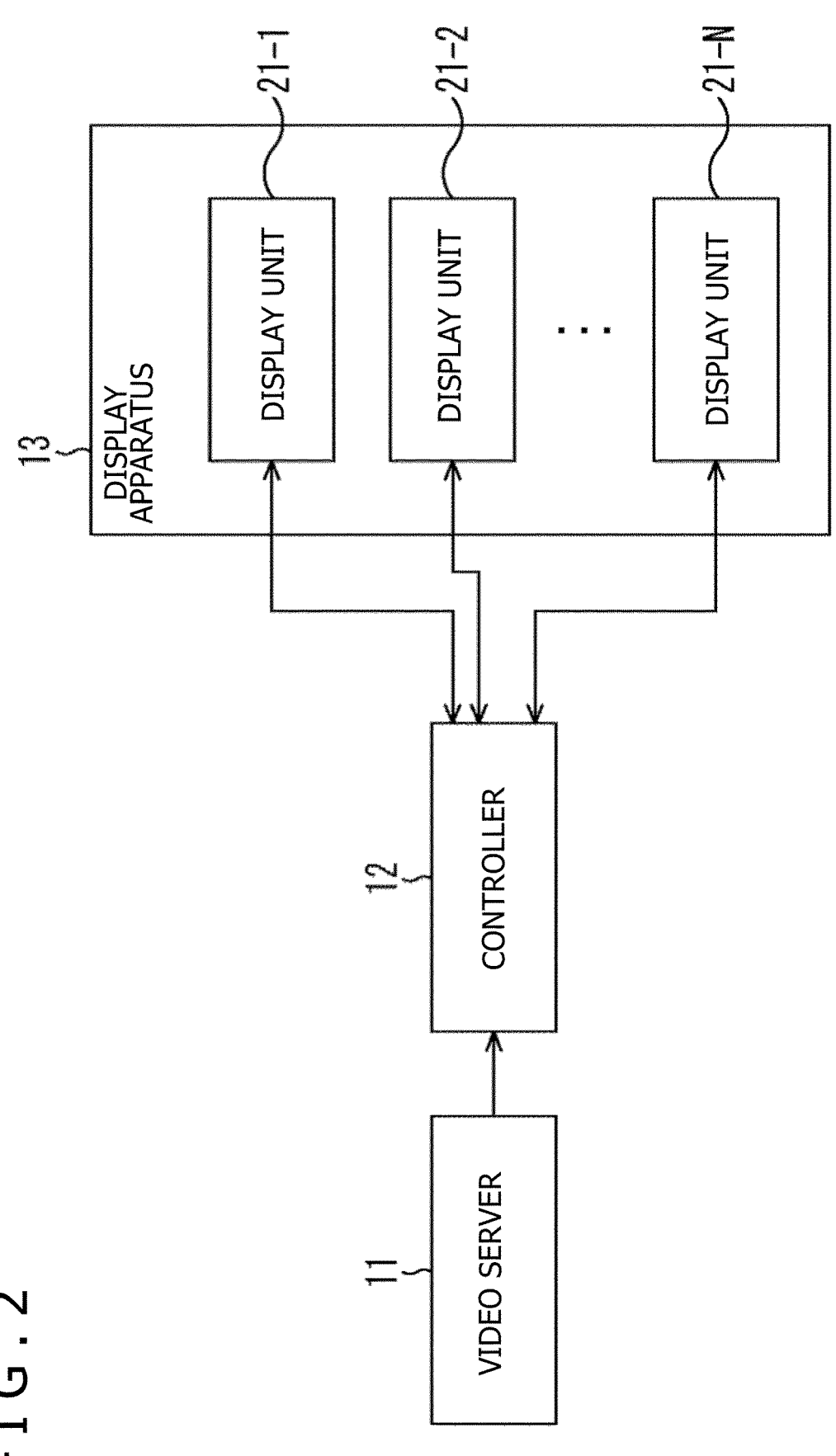
FIG. 2 is a diagram depicting a configuration example of an image display system to which the present technology is applied.

Embodiments to which the present technology is applied will be described below with reference to the drawings.

First Embodiment

<Present Technology>

The present technology relates a display module using LED elements as light sources, and an LED tiling display including an array of a plurality of display modules.

In the present technology, the display module is provided with a film for reducing light (outside light) incident from outside and that is reflected from the display module, thus allowing reflection of the outside light to be suppressed to improve visual quality.

The LED tiling display is a display apparatus obtained by juxtaposing any number of display modules like tiles.

Additionally, the display modules constituting such an LED tiling display is a panel-shaped (flat plate-shaped) display device obtained, for example, by mounting and aligning, on an electronic board, a plurality of LED elements used as light sources for display of images.

In general, in the display module, outside light incident on the display module from outside is reflected from a metal material of the LED element portion or from an internal portion of the display module other than the LED elements. Accordingly, in common display modules, the visual quality of display images, that is, the bright contrast of display elements, is degraded by the reflection of outside light occurring at the LED element portion or the like as described above.

On the other hand, the organic LED display apparatus may be provided with a circular polarizing film to reduce reflection of outside light from a display surface.

As such a circular polarizing film, a film is used that corresponds to a combination of a linear polarizing film (hereinafter simply referred to as the polarizing film) and a quarter wavelength film.

For example, as the polarizing film, a film is used that is obtained by adsorbing iodine, a dichroic dye, or the like onto a hydrophilic polymer film and uniaxially stretching the resultant film. In particular, a polarizing film suitably used is a polyvinyl alcohol-based film onto which iodine is adsorbed.

In contrast to known televisions, monitors, and the like, each of the display modules constituting the LED tiling display includes no bezel at an end portion of the display module because the entire front surface of the display module forms a display surface. Accordingly, the visual quality of the display surface extending to a peripheral end is important.

In the LED tiling display, for example, a display module MJ11-1 and a display module MJ11-2 are disposed at a predetermined interval as depicted in FIG. 1. Note that, in a case where the display module MJ11-1 and the display module MJ11-2 need not be particularly distinguished from each other, the display module MJ11-1 and the display module MJ11-2 may also simply be referred to as the display modules MJ11.

In this example, in the display module MJ11-1, a plurality of LED elements including LED elements EL11-1 to EL11-3 is juxtaposed at regular intervals in a vertical direction and in a horizontal direction in the figure. Similarly, in the display module MJ11-2, a plurality of LED elements including LED elements EL11-4 and EL11-5 is juxtaposed at regular intervals in the vertical direction and in the horizontal direction in the figure.

In a case where the LED elements provided in the display module MJ11, such as the LED elements EL11-1 to EL11-5, need not hereinafter particularly be distinguished from one another, the LED elements are also simply referred to as the LED elements EL11.

In the example depicted in FIG. 1, L11 denotes a distance between the adjacent LED elements EL11 in the display module MJ11, that is, the arrangement pitch of the LED elements EL11 in the display module MJ11.

In the LED tiling display, a plurality of the display modules MJ11 displays one image, and thus a distance L12 between outermost peripheral LED elements EL11 in the adjacent display modules MJ11 needs to be substantially equivalent to the arrangement pitch L11 of the LED elements EL11.

In this example, for example, the LED element EL11-3 positioned closest to an end of the display module MJ11-1 is the outermost peripheral LED element EL11 of the display module MJ11-1.

Additionally, the LED element EL11-4 positioned closest to an end of the display module MJ11-2 is the outermost peripheral LED element EL11 of the display module MJ11-2. Moreover, of the LED element EL11 provided in the display module MJ11-2, the LED element EL11-4 is positioned closest to the LED element EL11-3.

Consequently, the distance between the LED element EL11-3 and the LED element EL11-4 is a distance L12 between the outermost peripheral LED elements EL11 in the adjacent display modules MJ11. The distance L12 as described above is also referred to as the arrangement pitch of the LED elements EL11 between the display modules MJ11.

To set the arrangement pitch L12 to a distance equivalent to the arrangement pitch L11, a distance L13 needs to be equal to or shorter than half the arrangement pitch L11, the distance L13 extending from the LED element EL11 at the outermost periphery of the display module MJ11 to the outermost contour of the display module MJ11, in other words, the end portion of the display module MJ11. Additionally, in view of a possible distance between the adjacent two display modules, the distance L13 may be shorter than half the arrangement pitch L11.

In this example, the distance L13 is from the LED element EL11-4 or the LED element EL11-5 disposed at an outermost peripheral position, in other words, positioned closest to the end of the display module MJ11-2, to the end (outermost contour) of the display module MJ11-2.

In the LED tiling display, increased definition of display image quality (images) may reduce the arrangement pitch L11 of the LED elements EL11 to several hundred microns. Since the distance from the LED element EL11 at the outermost periphery of the display module MJ11 to the outermost contour of the display module MJ11 is shorter than half the arrangement pitch L11 of the LED element EL11, a reduction in the arrangement pitch L11 leads to narrowed arrangement of the display module MJ11.

In a case where a circular polarizing film as used in the above-described organic LED display apparatus is used in the LED tiling display as described above, the dimension and quality of the end portion of the circular polarizing film are very important.

However, common circular polarizing films may be subjected to moist heat shrinkage due to a temperature or a humidity of a usage environment, preventing the entire end portion of the display surface of the display module from being covered with the circular polarizing film. Additionally, moisture entering from the end portion of the circular polarizing film may dissolve iodine, leading to a loss of the polarizing function of the periphery of the circular polarizing film end portion.

Furthermore, the use of a common circular polarizing film may cause light emitted from the LED elements inside the display module, in other words, on the inner side of the display surface to be guided to the peripheral portion of the circular polarizing film, in other words, the end portion of the circular polarizing film. Then, the end portion may emit light, degrading the image quality (quality) of displayed images.

Accordingly, the present technology allows possible moist heat shrinkage, dissolution of iodine, and light emission from the end portion of the circular polarizing film to be suppressed by reducing, to 10 μm or less, a thickness of the polarizing film constituting the circular polarizing film, by using a particular material for a protective layer constituting the circular polarizing film or applying a colored resin material to the end portion of the circular polarizing film. This allows the visual quality of images to be improved in the LED tiling display, that is, in the display module.

<Configuration Example of Image Display System>

Now, the present technology will be more specifically described.

FIG. 2 is a diagram depicting a configuration example of an embodiment of an image display system to which the present technology is applied.

The image display system depicted in FIG. 2 includes a video server 11, a controller 12, and a display apparatus 13.

The video server 11 includes, for example, one or more pieces of external equipment such as a personal computer or a recorder, and supplies video signals of contents to be reproduced by the display apparatus 13 and appropriately controls the operation of the controller 12.

The controller 12 executes predetermined signal processing on a video signal supplied from the video server 11 and supplies the video signal obtained to the display apparatus 13, and executes reproduction control processing such as start and stop of reproduction of contents in response to instructions from the video server 11.

For example, the controller 12 executes, as signal processing, processing for generating, on the basis of a video signal of a content, a plurality of divided video signals each causing a part of an image (video) based on the video signal to be displayed. The controller 12 supplies the resultant plurality of divided video signals to the display apparatus 13. Here, for example, by causing the images based on the plurality of divided video signals to be displayed side by side, the divided video signals are generated in such a manner that the image based on the video signal of the content is displayed. Note that the video server 11 may generate the divided video signals.

The display apparatus 13 is a LED tiling display shaped like a panel (shaped like a flat plate) and displaying images using LED elements as light sources. The display apparatus 13 includes N display units 21-1 to 21-N.

The display units 21-1 to 21-N include a plurality of display modules each corresponding to the display module MJ11 described above, and cause the display modules to display images on the basis of the divided video signals supplied from the controller 12.

Note that, in a case where the display units 21-1 to 21-N need not hereinafter particularly be distinguished from one another, the display units 21-1 to 21-N are also simply referred to as the display units 21.

In this example, each display unit 21 functions as one display apparatus, and the N display units 21 are juxtaposed like tiles and connected together to constitute the display apparatus 13.

Additionally, in the example described with reference to FIG. 2, one controller 12 is provided for the display apparatus 13. However, the present technology is not limited to this, and any plurality of controllers 12 may be provided for the display apparatus 13, and each of the controllers 12 may connect to one or more display units 21 different from one another.

In such a case, the video server 11 supplies divided video signals to each of the plurality of controllers 12, the divided video signals corresponding to the controllers 12 and each causing a part of the image based on the video signal of the content to be displayed. Then, on the basis of the divided video signal supplied from the video server 11, each controller 12 generates a divided video signal to be supplied to the display unit 21 connected to the controller 12.

<Configuration Example of Controller and Display Unit>

Figure 4:
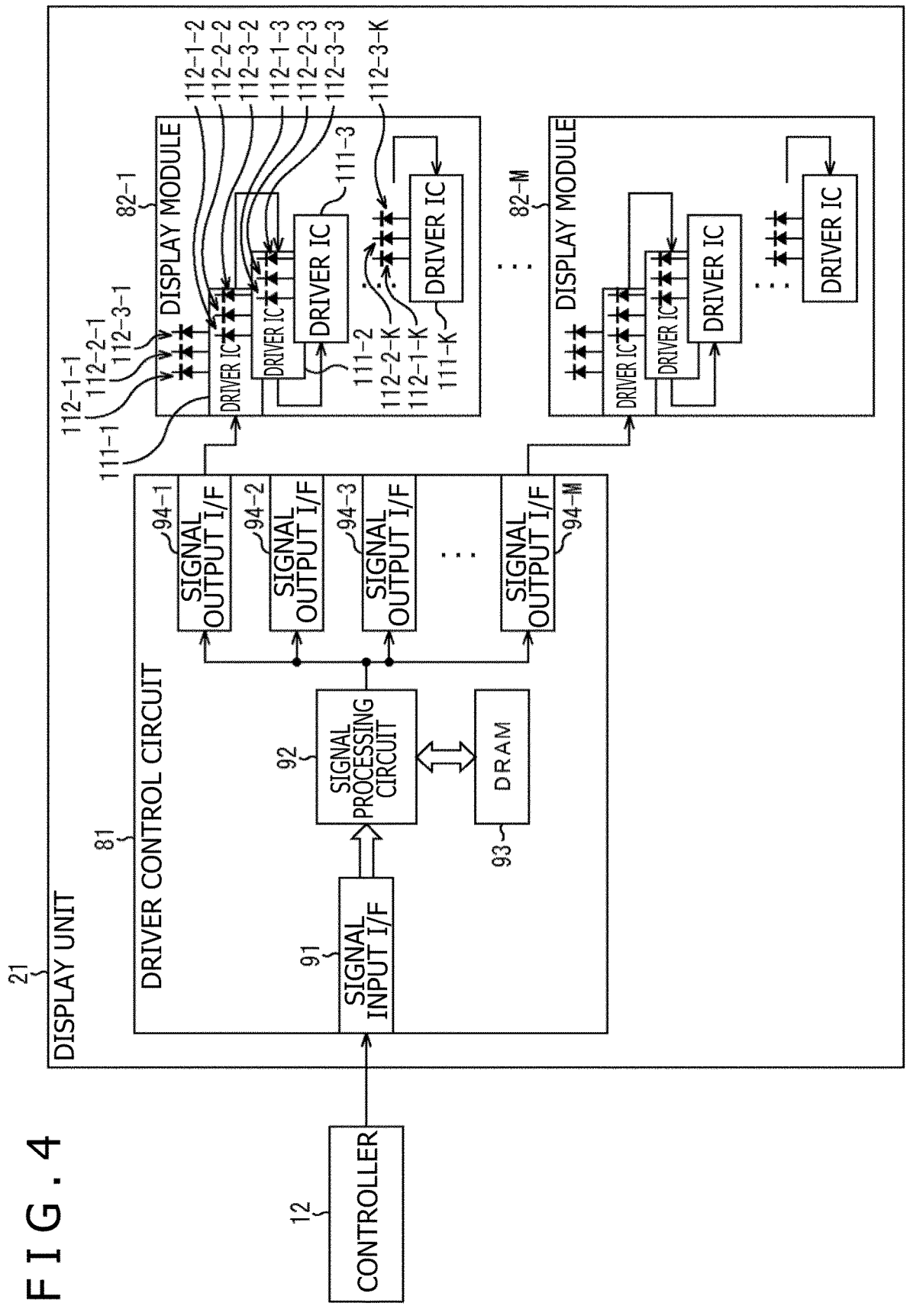
FIG. 4 is a diagram depicting a configuration example of a display unit.

Additionally, for example, the controller 12 and the display unit 21 depicted in FIG. 2 are configured as depicted in FIGS. 3 and 4.

FIG. 3 is a diagram depicting a configuration example of the controller 12.

In this example, the controller 12 includes a network I/F (Interface) 51, an MPU (Micro Processing Unit) 52, a signal input I/F 53, a signal processing circuit 54, a DRAM (Dynamic Random Access Memory) 55, a signal distribution circuit 56, and signal output I/Fs 57-1 to 57-N.

The controller 12 is connected to a personal computer (PC) as the video server 11, via a network, for example, a LAN (Local Area Network), and is adapted such that the PC or the like can control the operation of the controller 12.

The network I/F 51 supplies the MPU 52 with various instructions received from the PC or the like, and transmits, to the PC or the like, responses corresponding to the instructions supplied from the MPU 52.

The MPU 52 controls the signal processing circuit 54 in accordance with an instruction supplied from the network I/F 51, causes the signal processing circuit 54 to execute signal processing in accordance with an instruction from the PC or the like, and supplies the result of the execution to the network I/F 51 as a response to the instruction.

For example, the MPU 52 instructs the signal processing circuit 54 to execute various signal processing operations such as generation of divided video signals and to execute reproduction control processing such as stop of reproduction of the content.

Additionally, the controller 12 is connected to the PC as the video server 11, a recorder, and the like via cables complying with standards, for example, HDMI (registered trademark) (High-Definition Multimedia Interface), DVI (Digital Visual Interface), DP (DisplayPort), and the like.

The signal input I/F 53 supplies the signal processing circuit 54 with the video signal of the content received from the PC, recorder, or the like via the cable, the input terminal, or the like.

Under the control of the MPU 52, the signal processing circuit 54 executes various signal processing operations on the video signal supplied from the signal input I/F 53. At this time, the signal processing circuit 54 appropriately supplies the DRAM 55 with data required for signal processing such that the DRAM 55 holds the data, and reads the data held in the DRAM 55 and uses the data for signal processing. Additionally, for example, the signal processing circuit 54 appropriately supplies the signal distribution circuit 56 with a signal obtained by signal processing.

For example, the signal processing in the signal processing circuit 54 generates N divided video signals corresponding to the N display units 21. Additionally, the signal processing circuit 54 executes signal processing related to the entire content or the entire display apparatus 13, for example, color tone correction for the entire image based on the video signal.

The signal distribution circuit 56 distributes (outputs), to the signal output I/Fs 57-1 to 57-N corresponding to the display units 21, divided video signals supplied from the signal processing circuit 54 and corresponding to the N display units 21.

The signal output I/Fs 57-1 to 57-N are connected to the display units 21-1 to 21-N via cables or the like.

The signal output I/Fs 57-1 to 57-N supply the divided video signals supplied from the signal distribution circuit 56 to the display units 21-1 to 21-N connected to the signal output I/Fs 57-1 to 57-N.

Note that, in a case where the signal output I/Fs 57-1 to 57-N need not hereinafter particularly be distinguished from one another, the signal output I/Fs 57-1 to 57-N are also simply referred to as the signal output I/Fs 57.

FIG. 4 is a diagram depicting a configuration example of the display unit 21.

In this example, the display unit 21 includes a driver control circuit 81 and display modules 82-1 to 82-M.

In response to the supply of the divided video signals from the signal output I/Fs 57 of the controller 12, the driver control circuit 81 controls the display modules 82-1 to 82-M to cause the display modules 82-1 to 82-M to display images based on the divided video signals.

The driver control circuit 81 includes a signal input I/F 91, a signal processing circuit 92, a DRAM 93, and signal output I/Fs 94-1 to 94-N.

The signal input I/F 91 supplies the signal processing circuit 92 with the divided video signals supplied from the signal output I/Fs 57 of the controller 12.

The signal processing circuit 92 executes various signal processing operations that are individually performed by the respective display units 21 on the divided video signals supplied from the signal input I/F 91. At this time, the signal processing circuit 92 supplies the DRAM 93 with data required for the signal processing such that the DRAM 93 holds the data, and reads the data held in the DRAM 93 and uses the data for the signal processing.

For example, the signal processing circuit 92 generates drive signals for causing the display modules 82-1 to 82-M to be driven to display images based on the divided video signals, and supplies the drive signals to the signal output I/Fs 94-1 to 94-M.

The signal output I/Fs 94-1 to 94-N connect to the display modules 82-1 to 82-M. The signal output I/Fs 94-1 to 94-N supply the drive signals supplied from the signal processing circuit 92 to the display modules 82-1 to 82-M connected to the signal output I/Fs 94-1 to 94-N.

Note that, in a case where the signal output I/Fs 94-1 to 94-N need not hereinafter particularly be distinguished from one another, the signal output I/Fs 94-1 to 94-N are also simply referred to as the signal output I/Fs 94.

The display modules 82-1 to 82-M emit light on the basis of the drive signals supplied from the signal output I/Fs 94-1 to 94-M to display images corresponding to the drive signals. Thus, the display modules 82-1 to 82-M displays images based on the divided video signals, in other words, a part of the image of the content.

The display module 82-1 includes a plurality of driver ICs (Integrated Circuits) 111-1 to 111-K and LED elements 112-1-1 to 112-3-K.

The driver ICs 111-$k$ (k=1, 2, . . . , K) causes the LED elements 112-1-$k$ to 112-3-$k$ (k=1, 2, . . . , K) to be driven to emit light on the basis of drive signals supplied from the signal output I/F 94-1 directly or via other driver IC or circuits.

The LED elements 112-1-$k$ to 112-3-$k$ (k=1, 2, . . . , K) are, for example, light emitting elements outputting light in the colors R, G, and B, and emit light under the control of the driver ICs 111-$k$ (k=1, 2, . . . , K).

Additionally, like the display module 82-1, the other display modules 82-$m$ (m=2, . . . , M) are provided with diver ICs and LED elements corresponding to the driver ICs 111-1 to 111-K and the LED elements 112-1-$k$ to 112-3-$k$, though these diver ICs and LED elements carry no reference signs for visibility of the drawing.

Note that, in a case where the display modules 82-1 to 82-M need not hereinafter particularly be distinguished from one another, the display modules 82-1 to 82-M are also simply referred to as the display modules 82.

Additionally, in a case where the driver ICs 111-1 to 111-K need not hereinafter particularly be distinguished from one another, the driver ICs 111-1 to 111-K are also simply referred to as the driver ICs 111. In a case where the LED elements 112-1-1 to 112-3-K need not hereinafter particularly be distinguished from one another, the LED elements 112-1-1 to 112-3-K are also simply referred to as the LED elements 112.

<Configuration Example of Display Module>

As described with reference to FIGS. 2 to 4, the display apparatus 13 is obtained by juxtaposing the plurality of display modules 82 like tiles.

Specifically, for example, as depicted in FIG. 5, the display apparatus 13 includes a plurality of display modules 82 each shaped like a panel (flat plate) and including a plurality of LED elements 112 functioning as light sources for displaying images.

In particular, in the display apparatus 13, the display unit 21 is the minimum unit configuration functioning as a display apparatus; the display unit 21 is referred to as a cabinet and obtained by juxtaposing a plurality of the display modules 82 like tiles. In the example depicted in FIG. 4, one display unit 21 includes M display modules 82.

Furthermore, a plurality of such display units 21 is juxtaposed like tiles to form one display apparatus 13.

In the example depicted in FIG. 2, N display units 21 constitute the display apparatus 13. Consequently, in this example, one surface (flat surface) including the front surfaces of (M×N) display modules 82 forms a display surface of the display apparatus 13. Accordingly, no bezel is provided at outer peripheral portions (end portions) of the display module 82 and the display unit 21.

The controller 12 independently controls each of the plurality of display units 21 constituting the display apparatus 13 to cause the LED elements 112 provided in each display module 82 to emit light, causing the entire display surface of the display apparatus 13 to display an image.

Note that the plurality of display modules 82 constituting the display apparatus 13 may have the same size and shape or include the display modules 82 with different shapes or sizes. Similarly, the plurality of display units 21 constituting the display apparatus 13 may have the same size and shape or include the display units 21 with different shapes or sizes.

Furthermore, the number of display modules 82 constituting the display apparatus 13 or the display unit 21 can have any value, and the number of display units 21 constituting the display apparatus 13 can have any value.

Now, a more detailed configuration example of the display module 82 will be described.

For example, as depicted in FIG. 6, the display module 82 includes display section 151 shaped like a panel (flat plate) and a circular polarizing film 152 disposed on a front surface of the display section 151.

Note that FIG. 6 depicts a cross-sectional view of the display module 82 as seen from a direction parallel to a surface (front surface) of the display module 82 corresponding to an image display surface. In other words, FIG. 6 depicts a cross-sectional view of the display module 82 as seen from a direction perpendicular to the normal of the display surface of the display module 82.

In this example, the display section 151 includes an electronic board 161 and a planarization layer 162 formed on a circular polarizing film 152 side surface of the electronic board 161.

In particular, here, a plurality of LED elements including LED elements 171-1 to 171-3 is juxtaposed at predetermined intervals on the circular polarizing film 152 side surface of the electronic board 161.

The LED elements such as the LED elements 171-1 to 171-3 correspond to the LED elements 112 depicted in FIG. 4. Note that, in a case where the LED elements mounted and aligned on the electronic board 161, such as the LED elements 171-1 to 171-3, need not particularly be distinguished from one another, the LED elements are also simply referred to as the LED elements 171.

In the display section 151, the planarization layer 162 is formed by using a resin material 172 to planarize the peripheries of the LED elements 171 mounted on the electronic board 161, that is, a mounting surface for the LED elements 171. In other words, in the planarization layer 162 provided between the electronic board 161 and the circular polarizing film 152, the resin material 172 forming the planarization layer 162 covers each LED element 171.

Forming the planarization layer 162 as described above planarizes the circular polarizing film 152 side front surface of the display section 151, allowing the circular polarizing film 152 to be disposed on the display section 151 without any gap to improve adhesiveness.

Furthermore, on the electronic board 161, a plurality of LED elements 171 is juxtaposed at regular predetermined intervals, that is, at a predetermined arrangement pitch L21 in a horizontal direction and a depth direction in the figure. The arrangement pitch L21 corresponds to an arrangement pitch L11 in FIG. 1.

Additionally, for the distance from the outermost peripheral LED element 171 in the display module 82, in other words, the LED element 171 positioned closest to the end (side surface) of the display section 151, such as the LED element 171-1, to the outermost peripheral LED element 171 in another display module 82 adjacent to the display module 82 described above, this distance is substantially the same as the arrangement pitch L21.

Consequently, a distance L22 from the LED element 171 such as the LED element 171-1 positioned closest to the end of the display section 151 to the end of the display section 151 (side surface of the display module 82) is shorter than half the arrangement pitch L21. The distance L22 corresponds to the distance L13 in FIG. 1. Note that the distance L22 is equal to or shorter than half the arrangement pitch L21.

In addition, in a case where the display module 82 is viewed from a direction perpendicular to the front surface of the display module 82, the contour of the display section 151, that is, the shape and the size of the display section 151, are substantially the same as (substantially equal to) the contour (shape and size) of the circular polarizing film 152, that is, the display section 151 has substantially the same shape and size as those of the circular polarizing film 152, and the display section 151 and the circular polarizing film 152 overlap.

Additionally, the above-described driver ICs 111 may be mounted on the electronic board 161 or formed in the electronic board 161 by lamination or provided outside the electronic board 161 and electrically connected to the LED elements 171.

The circular polarizing film 152 is a film for reducing outside light incident on the display module 82 from outside and that is reflected from the front surface of the display module 82 or inside the display module 82, and includes, for example, a quarter wavelength film, a protective layer and a polarizing film.

In this example, the circular polarizing film 152 includes a quarter wavelength film 181, a protective layer 182-1, a polarizing film 183, a protective layer 182-2, and a low-reflection layer 184.

The quarter wavelength film 181 is a film functioning as a quarter wavelength plate (quarter λ plate) and bonded to a front surface of the planarization layer 162 by a bonding layer 185-1 including an adhesive.

Additionally, the protective layer 182-1 is provided, via a bonding layer 185-2 similar to the bonding layer 185-1, on a surface of the quarter wavelength film 181 that is opposite to the display section 151 side.

The polarizing film 183 is bonded, by a bonding layer 185-3 similar to the bonding layer 185-1, to a surface of the protective layer 182-1 that is opposite to the quarter wavelength film 181 side. The polarizing film 183 is a film functioning as a polarizer (linear polarizer).

Furthermore, the protective layer 182-2 is provided, via a bonding layer 185-4 similar to the bonding layer 185-1, on a surface of the polarizing film 183 that is opposite to the protective layer 182-1 side.

The low-reflection layer 184 is provided on a surface of the protective layer 182-2 that is opposite to the polarizing film 183 side, that is, the front surface of the display module 82 that is opposite to the display section 151 side. The front surface of the low-reflection layer 184 forms the image display surface of the display module 82.

Note that the bonding layers 185-1 to 185-4 need not particularly be distinguished from one another, the bonding layers 185-1 to 185-4 are also simply referred to as the bonding layers 185 and that protective layers 182-1 and 182-2 need not particularly be distinguished from each other, the protective layers 182-1 and 182-2 are also simply referred to as the protective layers 182.

Additionally, each bonding layers 185 may be formed by using the same material or different materials. Similarly, each protective layers 182 may be formed using the same material or different materials.

Furthermore, in the example described herein, the quarter wavelength film 181, the polarizing film 183, and the like are bonded by the bonding layers 185 including adhesives. However, the present technology is not limited to this configuration but these films may be pressure-sensitively adhered by using pressure sensitive layers including pressure sensitive agents.

In the display module 82, the quarter wavelength film 181 and the polarizing film 183 are provided side by side, and thus the circular polarizing film 152 functions as a circular polarizer.

By providing the display module 82 with the circular polarizing film 152, reflection of outside light can be suppressed, improving the visual quality of images provided by the display module 82, and more particularly the bright contrast of images.

That is, the provision of the circular polarizing film 152 enables a reduction in outside light incident from outside and that is reflected from the front surface of the planarization layer 162 or the electronic board 161, the LED element 171 portion, or the like.

Specifically, for example, outside light is assumed to be incident on the display section 151 from outside the display module 82 via the circular polarizing film 152. In this case, outside light which is non-polarized is linearly polarized upon passing through the polarizing film 183, and is then circularly polarized in a predetermined rotating direction, for example, clockwise rotation, upon passing through the quarter wavelength film 181.

When the circularly polarized outside light is reflected from the LED element 171 or the electronic board 161, the light is circularly polarized in a direction opposite to that at the time of incidence, for example, counterclockwise rotation, with the resultant circularly polarized light being incident on the quarter wavelength film 181.

The outside light thus reflected from the LED element 171 or the electronic board 161 (hereinafter also referred to as the reflected light) changes from the circularly polarized light to the linearly polarized light upon passing through the quarter wavelength film 181. The polarizing direction of the reflected light is obtained by rotating, through 90 degrees, the polarizing direction of outside light incident on the quarter wavelength film 181 from the polarizing film 183. In other words, the polarizing direction of reflected light incident on the polarizing film 183 from the quarter wavelength film 181 is the same as the direction of a reflection axis (absorption axis) of the polarizing film 183.

Consequently, the polarizing film 183 blocks reflected light that is reflected inside the display module 82 from the LED element 171, the electronic board 161, or the like and that passes through the quarter wavelength film 181. This allows reflected light from inside the display module 82 to be suppressed (reduced), improving the bright contrast.

When the circular polarizer (circular polarizing film 152) was actually disposed in the display section 151, the reflectivity of front surface of the display module 82 was observed to decrease to approximately one tenth, and the bright contrast of display images was observed to increase approximately ten times.

Now, with reference to FIGS. 7 to 17, the display module 82 will further be described in detail.

Note that the same reference signs are used in FIGS. 7 to 17 and FIG. 6 to denote corresponding portions and that the description of these portions is appropriately omitted. Additionally, the same reference signs are used in FIGS. 7 to 17 to denote corresponding portions, and the description of these portions is appropriately omitted. Furthermore, for visibility of drawings, some of the same reference signs in FIGS. 7 to 17 and FIG. 6 denoting corresponding portions are omitted.

For example, the quarter wavelength film 181 used in the circular polarizing film 152 is optimized at a wavelength near 550 nm, which involves a high luminosity factor. Note that, in order to improve a wavelength distribution characteristic, the circular polarizing film 152 used may include half or quarter wavelength films laminated together with the optical axes of the films orthogonal to one another.

Additionally, the polarizing film 183 can be obtained by adsorbing iodine or a dichroic dye onto a hydrophilic polymer film to color the hydrophilic polymer film and uniaxially stretching the resultant film. In particular, the polarizing film 183 suitably used can be obtained by adsorbing iodine onto a polyvinyl alcohol-based film.

Common polarizing films are produced by stretching and may shrink due to the temperature or the humidity of the usage environment.

Figure 7:
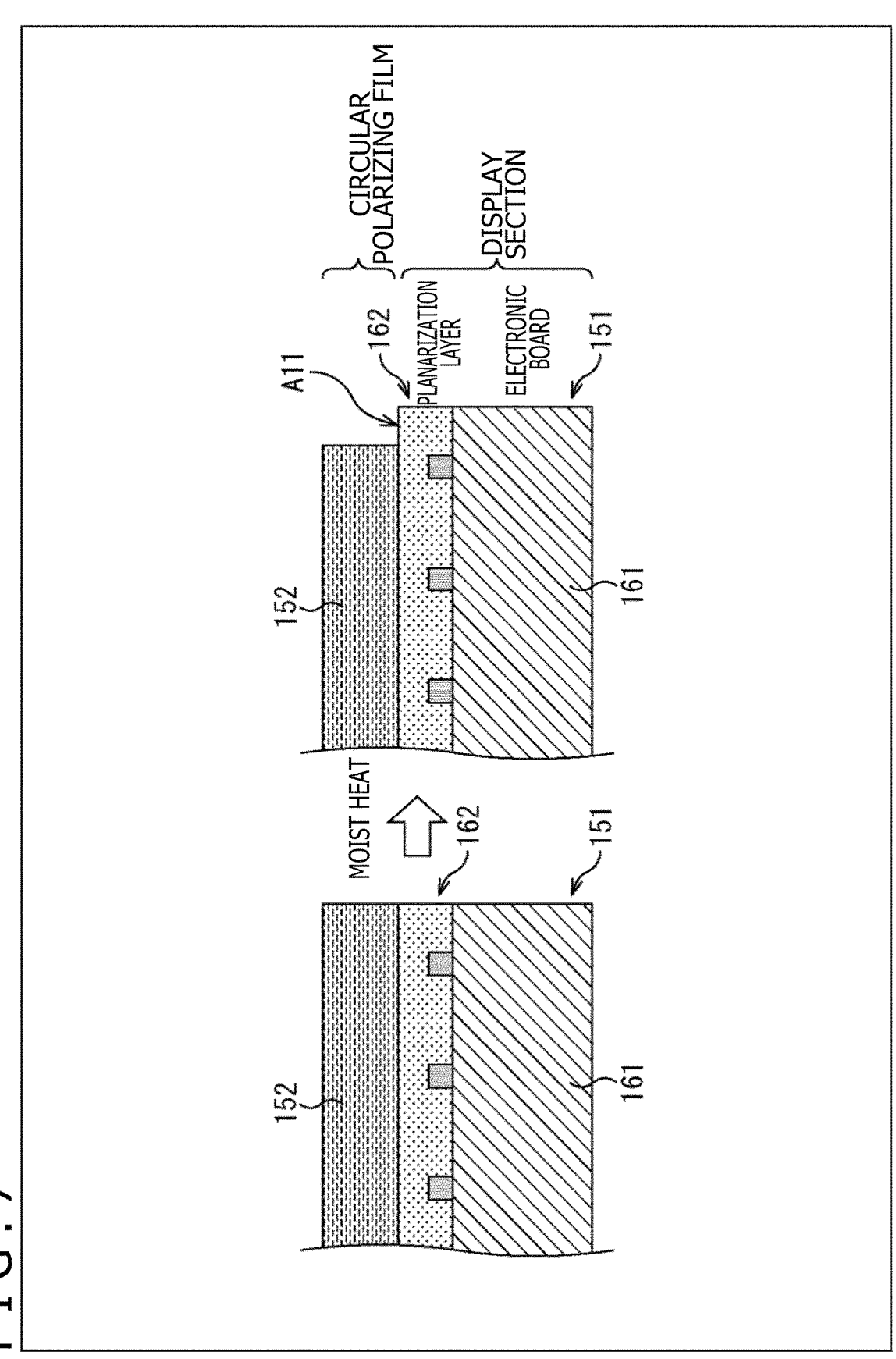
FIG. 7 is a diagram illustrating shrinkage of a circular polarizing film.

Given the polarizing film 183 shrinks, for example, as depicted in FIG. 7, the circular polarizing film 152 laminated with the same contour as that of the display section 151 shrinks to expose a portion of the front surface of the display section 151.

In this example, shrinkage of the circular polarizing film 152 has exposed that portion of the front surface of the planarization layer 162 in the display section 151 which is indicated by an arrow A11.

In a case where a portion of the front surface of the display section 151 is thus exposed, the visual quality of images is degraded at the exposed part as depicted in FIG. 8.

That is, in a case where outside light is incident on an unexposed portion of the display section 151 as indicated by an arrow A21, the circular polarizing film 152 suppresses (reduces) reflection of the outside light. Consequently, in the unexposed portion of the display section 151, the reflection of the outside light is suppressed to allow sufficiently high visual quality, in other words, sufficiently high bright contrast, to be obtained.

In contrast, in a case where outside light is incident on an exposed portion of the display section 151 as indicated by an arrow A22, the outside light is directly reflected from the front surface of the planarization layer 162 without the interposition of the circular polarizing film 152 and returns. That is, the circular polarizing film 152 is not present on the optical path of the outside light, and thus the outside light reflected from the front surface of the planarization layer 162 directly returns.

Consequently, in the exposed portion of the display section 151, the reflection of the outside light is reduced to degrade the visual quality of images at that portion, that is, the bright contrast of the image at that portion.

Figure 9:
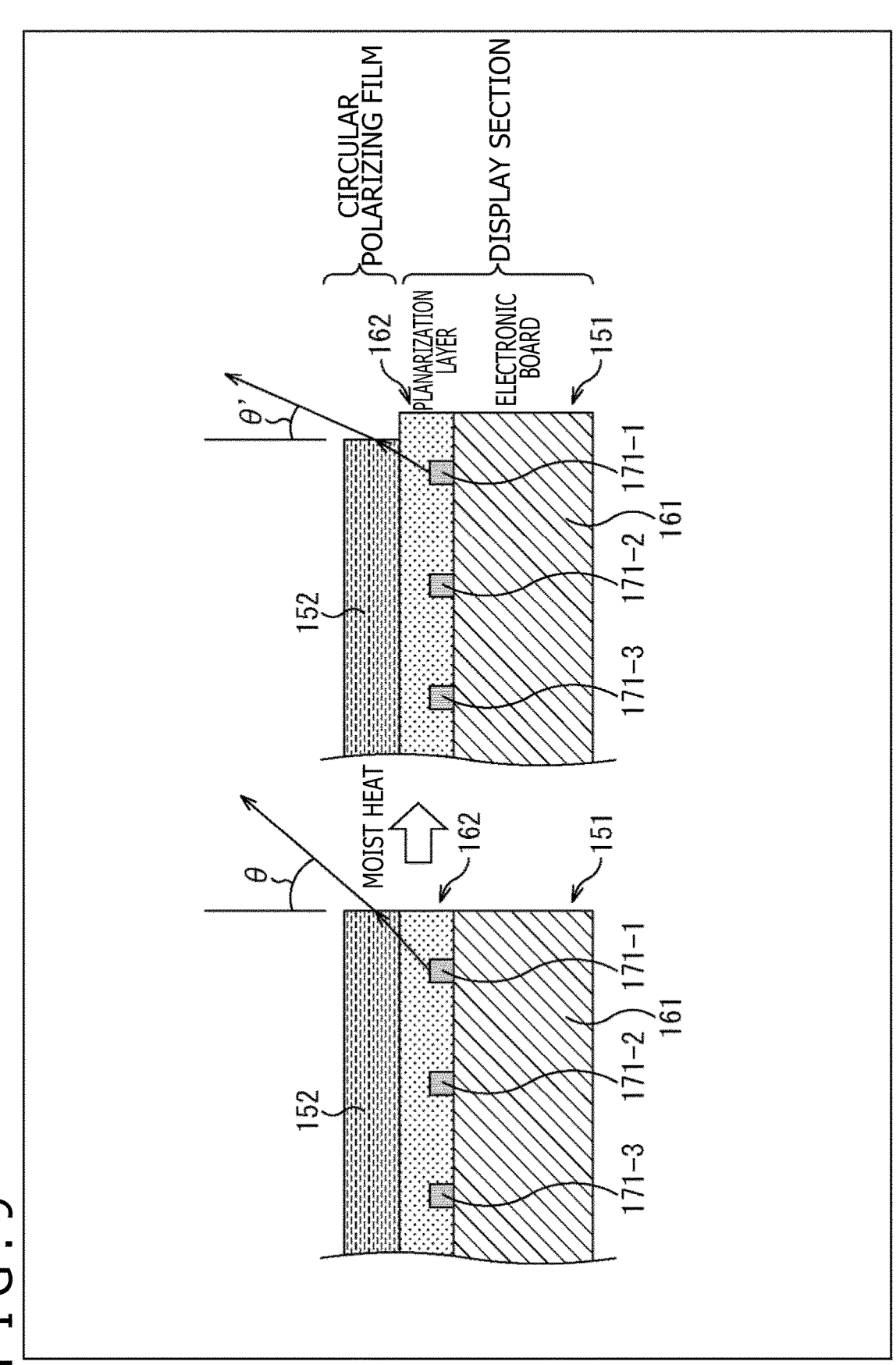
FIG. 9 is a diagram illustrating an angle at which light from an end of the circular polarizing film is observed.

Additionally, given the circular polarizing film 152 depicted in FIG. 7 shrinks to expose the end portion of the front surface of the display section 151, light from the end of the circular polarizing film 152 is likely to be observed even at an angle closer to that of the front surface, for example, as depicted in FIG. 9.

Specifically, for example, as depicted in the left of FIG. 9, with the front surface of the display section 151 unexposed, a portion of light output from the LED element 171-1 positioned closest to the end (side surface) of the display section 151 is assumed to be emitted from the end portion of the circular polarizing film 152.

In this case, given an angle θ between a direction perpendicular to the front surface of the circular polarizing film 152, in other words, the normal direction and the direction in which light from the LED elements 171-1 travels, the light having been emitted from the end portion of the circular polarizing film 152, the angle θ is somewhat large.

Accordingly, a user viewing an image displayed on the display module 82 from the front of the display module 82 or slightly obliquely from the front does not observe light output from the LED elements 171-1 and emitted from the end portion of the circular polarizing film 152 at the angle θ. Consequently, an image is presented at visual quality sufficient for the user.

In contrast, for example, as depicted in the right of FIG. 9, with the end portion of front surface of the display section 151 exposed, a portion of light output from the LED element 171-1 positioned closest to the end of the display section 151 is assumed to be emitted from the end portion of the circular polarizing film 152.

In this case, given an angle θ' between the direction perpendicular to the front surface of the circular polarizing film 152 and the direction in which light from the LED elements 171-1 travels, the light having been emitted from the end portion of the circular polarizing film 152, the angle θ' is smaller than the angle θ described above.

Accordingly, even a user viewing the image displayed on the display module 82 from a direction close to the front of the display module 82 is likely to observe light output from the LED elements 171-1 and emitted from the end portion of the circular polarizing film 152 at the angle θ'.

When the user observes the light emitted from the end portion of such the circular polarizing film 152, the contour portion of the displayed image, that is, the contour portion of the display module 82, appears bright to the user, leading to degraded visual quality of images.

Specifically, for example, in a case where the LED elements 171 described above has an arrangement pitch L21 of 1.26 mm, shrinking the circular polarizing film 152 by approximately 30 μm leads to an angle θ' of approximately 45 degrees. In this case, the user viewing the display module 82 from a direction at an angle of 45 degrees to the front of the display module 82 observes the light emitted from the end portion of the circular polarizing film 152.

For suppression of shrinkage of the circular polarizing film 152 as described above, in a possible configuration of the display module 82 to which the present technology is applied, the polarizing film 183 in FIG. 6 has a thickness of 10 μm or less in the vertical direction. This is because the present applicant has found that the polarizing film 183 having a thickness of 10 μm or less allows moist heat shrinkage of the circular polarizing film 152 to be effectively suppressed. However, the vertical thickness of the polarizing film 183 is not limited to 10 μm or less.

In such a manner, by using the polarizing film 183 with a thickness of 10 μm or less to form the circular polarizing film 152, the shrinkage of the circular polarizing film 152 can be suppressed that is caused by the temperature or the humidity of the usage environment, allowing the visual quality of images, that is, the bright contrast of the image to be effectively improved.

Specifically, the display module 82 to which the present technology is applied can suppress possible reflection of outside light from the exposed portion of the display section 151 as described with reference to FIG. 8 and also suppress observation of light from the end portion of the circular polarizing film 152 as described with reference to FIG. 9.

Additionally, the protective layers 182-1 and 182-2 of the display module 82 depicted in FIG. 6 may include, for example, films of TAC (Tri-Acetyl Cellulose), acrylic (PMMA (Poly Methyl Methacrylate)), COP (Cyclo Olefin Polymer), PET (Poly Ethylene Terephthalate), or the like.

In particular, the present applicant has found that the moist heat shrinkage of the circular polarizing film 152 can be suppressed by using, as the protective layer 182, a film including COP or PET as a material.

Consequently, by forming the protective layer 182 with use of COP or PET, the shrinkage of the circular polarizing film 152 can further be suppressed, improving the visual quality of images. In addition, the protective layer 182 used may include a polymer film other than, for example, COP and PET, the polymer film having low water absorption, that is, for example, having a moisture absorption percentage of a predetermined value or smaller.

Furthermore, the front surface of the display module 82, that is, the front surface of the circular polarizing film 152 may be subjected to low-reflection treatment.

In the display module 82 to which the present technology is applied, the low-reflection layer 184 is provided on the front surface of the circular polarizing film 152, in other words, the surface of the circular polarizing film 152 opposite to the display section 151 side. The low-reflection layer 184 reduces the reflection, from the low-reflection layer 184 portion, of outside light incident from outside.

Consequently, the provision of the low-reflection layer 184 as described above enables a reduction in the reflection, from the front surface of the circular polarizing film 152 (low-reflection layer 184), of outside light incident on the circular polarizing film 152 from outside, improving the bright contrast.

Note that the low-reflection layer 184 may be provided by using any method.

Specifically, an existing coating method or deposition method may be used to add the low-reflection layer 184 to that surface (front surface) of the protective layer 182-2 of the circular polarizing film 152 which is opposite to the display section 151 side.

In addition, for example, the low-reflection layer 184 may be provided by laminating, to the surface (front surface) of the protective layer 182-2 opposite to the display section 151 side, a film subjected to low reflection treatment, such as an AR (Anti Reflection) film or an LR (Low Reflection) film, or the like.

Additionally, in general, the polarizing film used is a polyvinyl alcohol-based film on which iodine is adsorbed. However, in a high-humidity environment, iodine may dissolve from an end surface of such a polarizing film to make the polarizing film transparent.

For example, in the display module 82 depicted in FIG. 6, when iodine dissolves from the polarizing film 183 to make the polarizing film 183 transparent, the functions of the circular polarizing film 152 are degraded, resulting in a reduced bright contrast.

Accordingly, to suppress the dissolution of iodine from the polarizing film 183, a resin material with a moisture-proof function may be applied to the end of the display module 82, that is, at least a portion of the side surface of the display module 82.

Figure 10:
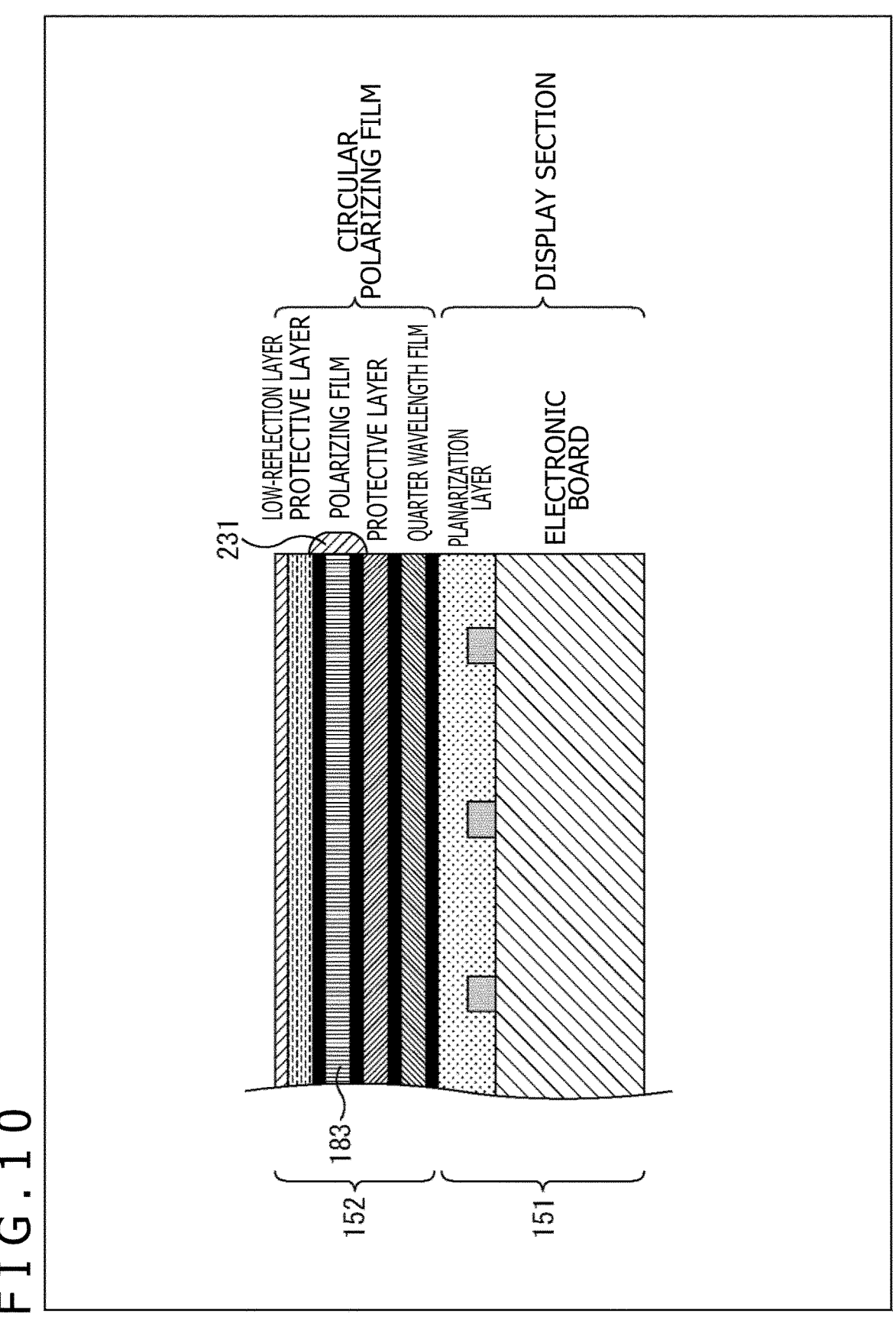
FIG. 10 is a diagram illustrating application of a resin material.

Specifically, for example, as depicted in FIG. 10, a resin material 231 with a moisture-proof function is applied to a part of the end portion of the circular polarizing film 152 in such a manner that the resin material 231 covers at least the end portion of the polarizing film 183, included in the end portion (side surface) of the display module 82.

Alternatively, for example, as depicted in FIG. 11, the resin material 231 may be applied to the entire end portion of the circular polarizing film 152 in such a manner that the resin material 231 covers the entire end portion of the circular polarizing film 152.

Furthermore, for example, as depicted in FIG. 12, the resin material 231 may be applied to the end portion (side surface) of the display module 82 in such a manner that the resin material 231 covers the entire end portion of the circular polarizing film 152 and at least a part of the end portion of the display section 151, both included in the end portion (side surface) of the display module 82. In this example, the resin material 231 covers the entire end portion of the planarization layer 162 and a part of the end portion of the electronic board 161, both included in the end portion of the display section 151. The resin material disposed as described above can be more effectively brought into close contact.

In the example depicted in FIGS. 10 to 12, at least the end portion of the polarizing film 183, included in the end portion of the display module 82, is covered with the resin material 231 with the moisture-proof function, allowing moisture from outside to be prevented from entering the polarizing film 183. This allows the dissolution of iodine from the polarizing film 183, that is, the transparency of the polarizing film 183 to be suppressed, improving the bright contrast.

Additionally, in the example depicted in FIGS. 10 to 12, the resin material 231 used may include an olefin, an acrylic, an allyl-, an epoxy-, a polyester-, a urethane-, a silicon-, or a fluorine-based resin, or any other resin.

In this case, for example, the resin material 231 effectively has a water vapor transmission rate of 100 g/m²·24 h@40° C.90% RH or less. That is, the resin material 231 can be used that, for example, exhibits a water vapor transmission rate of 100 g/m²·24 h or more when the water vapor transmission rate is measured, in accordance with JIS Z 0208 "Testing Methods for Determination of the Water Vapor Transmission Rate of Moisture-Proof Packing Materials," under an environment at a temperature of 40° C. and a humidity of 90% RH specified in condition B of JIS Z 0208 "Testing Methods for Determination of the Water Vapor Transmission Rate of Moisture-Proof Packing Materials."

Note that the resin material 231 may be a solvent-soluble resin such as any of the above-described materials or a reactive curable resin such as a UV-curable type, a thermosetting type, a moisture-curable type, or a two-component reaction type of any of the above-described materials, or the like. In particular, the reactive curable resin can be used as the resin material 231 to realize high durability.

Furthermore, for example, as depicted in FIG. 13, a plurality of LED elements including the LED elements 171-1 to 171-10 is assumed to be arranged inside the planarization layer 162 of the display section 151. Note that the LED elements 171-1 to 171-10 need not particularly be distinguished from one another, the LED elements 171-1 to 171-10 are also simply referred to as the LED elements 171.

For example, the LED elements 171-8 to 171-10, located near the center of the display section 151, are assumed to be on (emitting light), and the LED elements 171-1 to 171-7, located an outside the above-described LED elements 171, in other words, at the outer peripheral portion (end side) of the display section 151, are assumed to be off. Additionally, here, the resin material 231 is assumed not to be applied to the end portion of the display module 82.

In such a case, for example, a portion of light emitted from the LED element 171 located near the center of the display section 151, that is, the LED element 171-8 in this example, may become stray light. The stray light may be emitted from the end portion of the circular polarizing film 152 through the inside of the circular polarizing film 152.

In other words, even though light from the outer peripheral portion of the display section 151 is turned off, the end portion of the circular polarizing film 152 may emit light due to light output from the LED element 171 located in the central portion of the display section 151.

When the end portion of the circular polarizing film 152 emits light as described above, the visual quality of images, that is, the bright contrast may be degraded.

Additionally, not only the above-described resin material 231 may be provided at the end (side surface) portion of the display module 82 but the resin material 231 may also be blackened. In other words, the resin material 231 may include an edge emitting prevention function.

In such a configuration, the resin material 231 can absorb stray light resulting from, for example, light emission from the LED element 171 located near the center of the display section 151, preventing stray light from being emitted from the end portion of the circular polarizing film 152. This allows the bright contrast to be improved.

The resin material 231 can be colored by using, for example, a black inorganic pigment such as carbon black, titanium black, or metal composite oxide particulates, or any of various black organic pigments, an organic dye, or the like. Additionally, for the density of coloring of the resin material 231, for example, when an optical density (OD) value is 2.0 or more and further 2.5 or more at the thickness of the resin material 231 at the end portion of the circular polarizing film 152, stray light can be effectively prevented from being emitted.

To prevent stray light from leaking (being emitted) from the end portion of the circular polarizing film 152, at least the entire end portion of the circular polarizing film 152 may be covered with the resin material 231, for example, as depicted in FIG. 11.

Furthermore, for example, as depicted in FIG. 12, when the resin material 231 covers not only the end portion of the circular polarizing film 152 but also at least a part of the end portion of the display section 151, the resin material can be more effectively brought into close contact.

Additionally, any method may be used to apply the resin material 231 to the end (side surface) portion of the display module 82, and, for example, a method illustrated in FIGS. 14 to 17 is possible.

Figure 14:
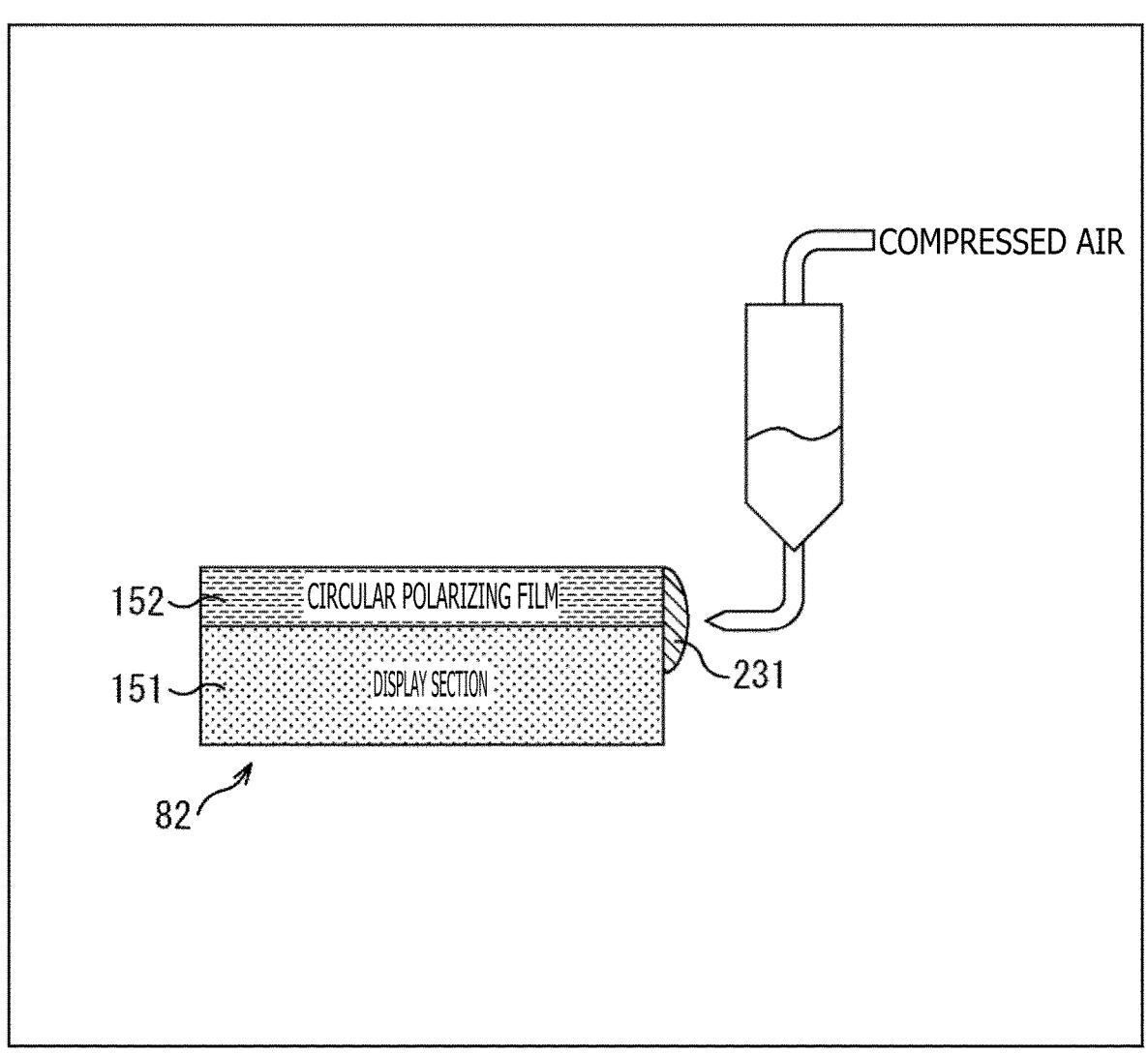
FIG. 14 is a diagram illustrating an application method for the resin material.

That is, for example, as depicted in FIG. 14, a possible method includes using a pneumatic dispenser to eject a liquid resin material by compressed air to apply the resin material to the end portion of the display module 82 as the resin material 231.

Similarly, for example, as depicted in FIG. 15, another possible method includes using a mechanical dispenser to eject a liquid resin material by a screw to apply the resin material to the end portion of the display module 82 as the resin material 231.

Figure 16:
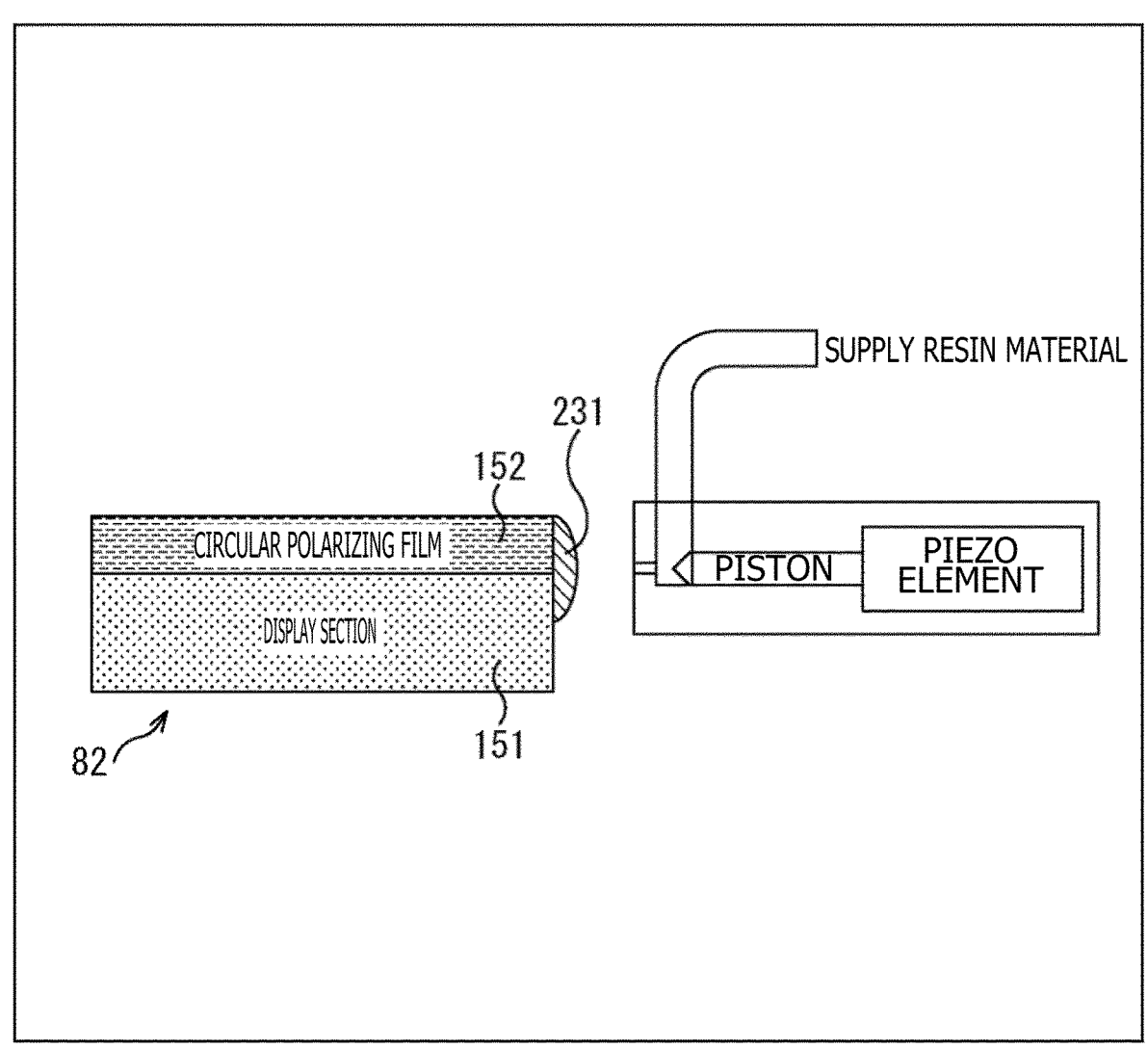
FIG. 16 is a diagram illustrating an application method for the resin material.

Furthermore, for example, as depicted in FIG. 16, yet another possible method includes using a piezo jet dispenser and causing, by a piezo element, a piston to be driven to eject a liquid resin material from a nozzle to apply the resin material to the end portion of the display module 82 as the resin material 231.

Figure 17:
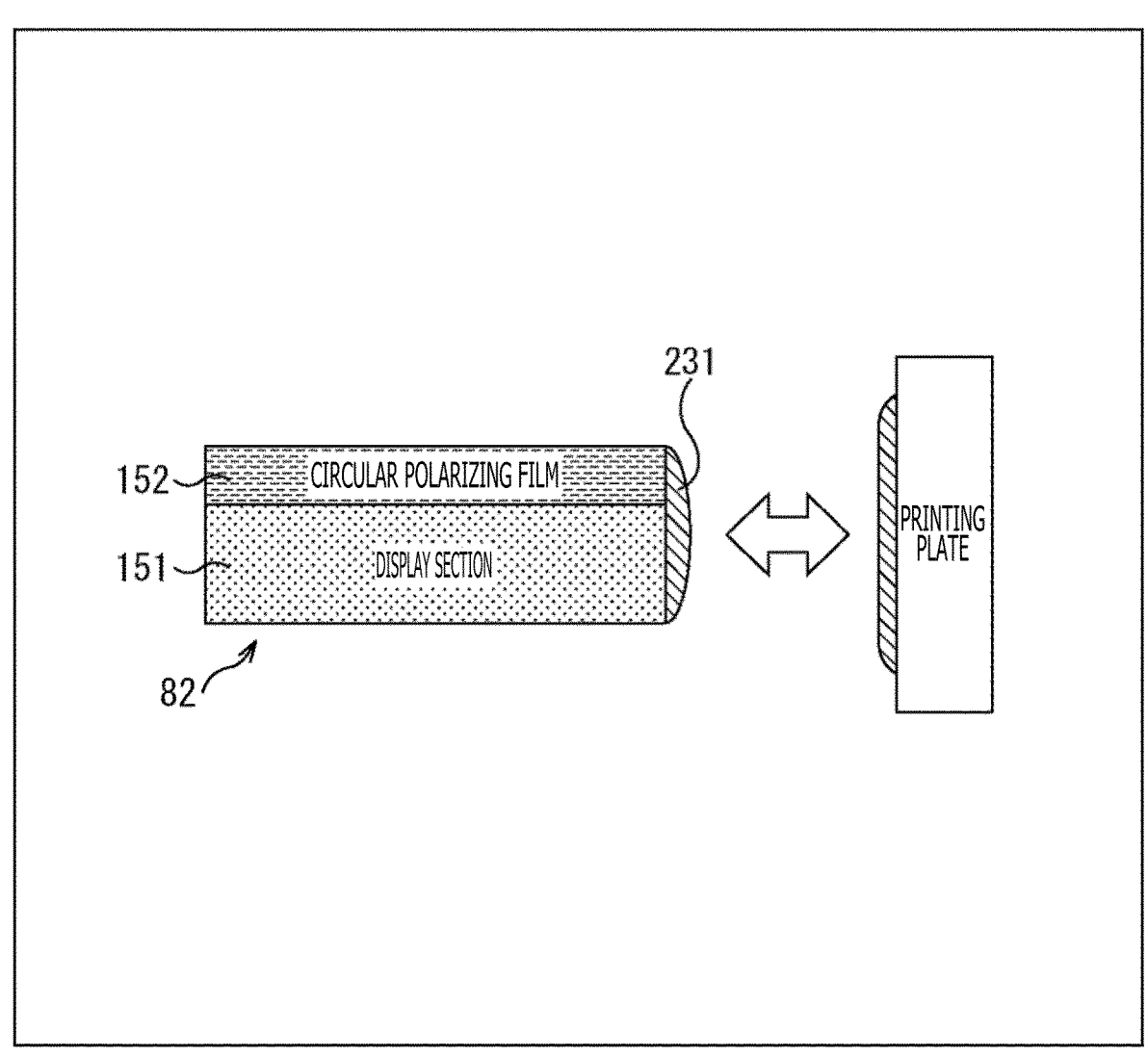
FIG. 17 is a diagram illustrating an application method for the resin material.

In addition, for example, as depicted in FIG. 17, still another possible method includes applying a resin material applied to a printing plate to the end portion of the display module 82 by printing as the resin material 231, that is, applying the resin material 231 by offset printing.

(Description of Manufacturing Processing)

Figure 18:
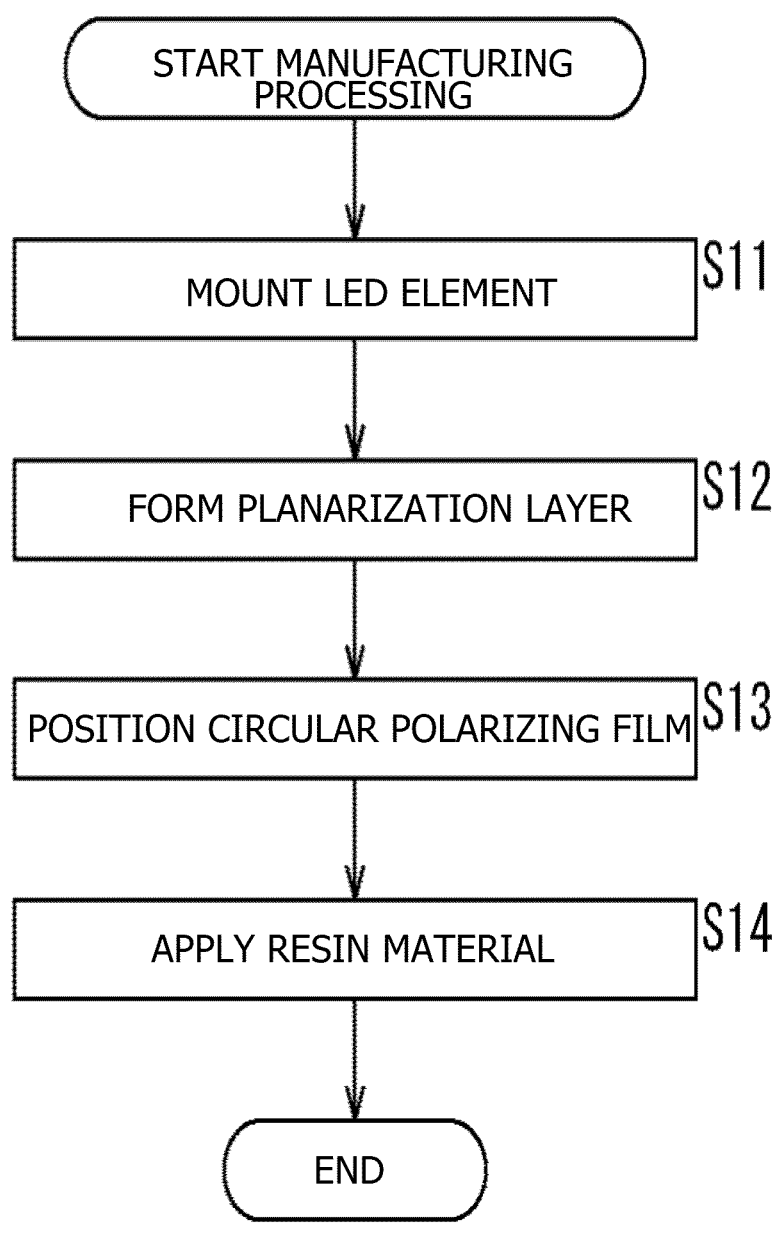
FIG. 18 is a flowchart illustrating manufacturing processing.

Now, a manufacturing method for the display module 82 will be described with reference to a flowchart in FIG. 18. That is, with reference to the flowchart in FIG. 18, the manufacturing method for the display module 82 will be described.

In step S11, as depicted in FIG. 6, a plurality of the LED elements 171 is mounted and aligned at the predetermined arrangement pitch on the electronic board 161.

In step S12, the resin material 172 is used to planarize the surface of the electronic board 161 on which the LED elements 171 are mounted, that is, the mounting surface for the LED elements 171, forming the planarization layer 162. Accordingly, the display section 151 is formed that includes the electronic board 161 and the planarization layer 162 as depicted in FIG. 6.

Then, in step S13, the circular polarizing film 152 is disposed on the front surface of the planarization layer 162 of the display section 151, that is, the front surface of the display section 151 corresponding to the side on which the LED elements 171 are disposed.

For example, the entire circular polarizing film 152 may be bonded or pressure-sensitively adhered to the front surface of the planarization layer 162, or the quarter wavelength film 181, the protective layer 182, the polarizing film 183, and the like may be laminated together in order to form the circular polarizing film 152 on the front surface of the planarization layer 162.

At this time, in a case where the display module 82 is viewed from a direction perpendicular to the front surface of the display module 82, the display section 151 and the circular polarizing film 152 appear to have the same size and shape and to overlap each other.

In step S14, the resin material 231 is applied to each end portion of the display module 82, including the display section 151 and the circular polarizing film 152, that is, each side surface portion, forming the final display module 82.

For example, in step S14, a method illustrated in FIGS. 14 to 17, or the like, is used to apply the resin material 231 to cover at least the end portion of the polarizing film 183 with the resin material 231, for example, as depicted in FIGS. 10, 11, and 12.

When the display module 82 is thus obtained, the manufacturing processing ends.

As described above, the display section 151 is formed, the circular polarizing film 152 is added to the display section 151, and furthermore, the resin material 231 is applied to the end portions of the circular polarizing film 152 and the display section 151, thus manufacturing the display module 82. This allows the display module 82 with high visual quality of images, that is, high bright contrast to be obtained.

By juxtaposing a plurality of the display modules 82 thus obtained, one display unit 21 is obtained, and by juxtaposing and connecting a plurality of the display units 21 together like tiles, the display apparatus 13 is obtained.

Modification Example 1 of First Embodiment (Other Configuration Example of Display Module)

Note that, in the example described above, the circular polarizing film 152 is used as a film for reducing outside light incident on the display module 82 and that is reflected from the front surface of the display module 82 or inside the display module 82. However, such a film used is not limited to the circular polarizing film 152 but may be a dimmer film or the like.

Figure 19:
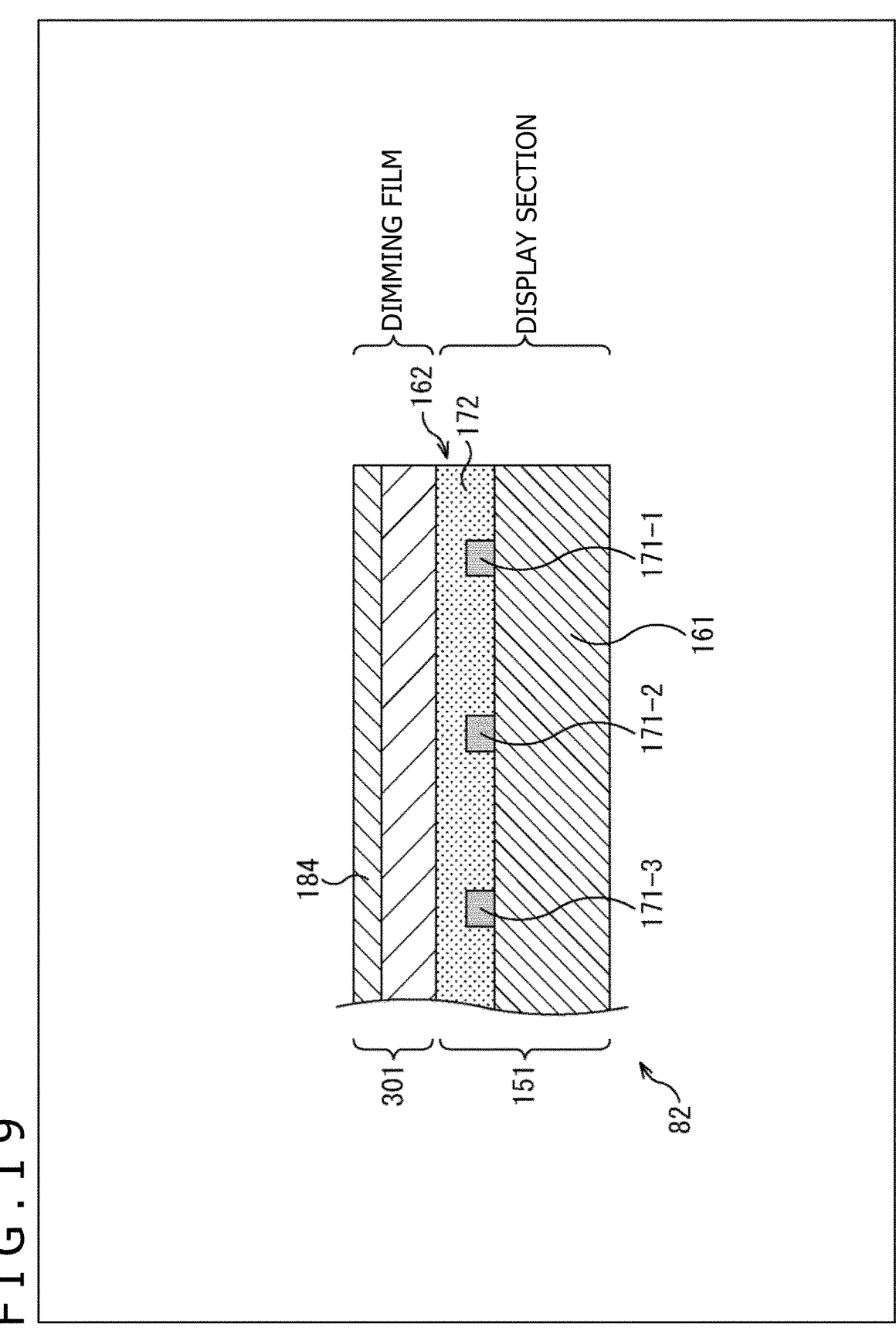
FIG. 19 is a diagram depicting another configuration example of the display module.

In a case where a dimmer film is provided in the display module 82, the display module 82 is configured, for example, as depicted in FIG. 19.

Note that the same reference signs are used in FIG. 19 and FIG. 6 to denote corresponding portions and that the description of these portions is appropriately omitted. FIG. 19 depicts a cross-sectional view of the display module 82 as viewed from a direction perpendicular to the normal of the display surface of the display module 82.

In the example illustrated in FIG. 19, the display module 82 includes the display section 151 and a dimmer film 301, and the display section 151 has the same configuration as that in FIG. 6.

That is, in the display section 151, a plurality of the LED elements 171 is mounted and aligned at the predetermined arrangement pitch on the electronic board 161, and the portions of the LED elements 171 are planarized by the resin material 172 to form the planarization layer 162.

Also in this example, the distance from the LED element 171 positioned closest to the end of the display section 151 to the end (side surface of the display module 82) of the display section 151 is equal to or shorter than half the arrangement pitch of the plurality of LED elements 171 in the display section 151.

Additionally, the dimmer film 301 is disposed on the front surface of the display section 151, that is, the front surface of the planarization layer 162 opposite to the electronic board 161 side.

In a case where the display module 82 is viewed from the direction perpendicular to the front surface of the display module 82, the contour of the display section 151, that is, the shape and the size of the display section 151, are substantially the same as the contour (shape and size) of the dimmer film 301 (the display section 151 has substantially the same shape and dimensions as those of the dimmer film 301), and the display section 151 and the dimmer film 301 overlap.

The dimmer film 301 is used as a film for reducing outside light incident on the display module 82 and that is reflected from the front surface of the display module 82 or inside the display module 82.

For example, the dimmer film 301 is an ND (Neutral Density) film having a neutral tone in a visible light region such as gray, and the wavelength components of light incident on the dimmer film 301 are uniformly reduced. That is, the dimmer film 301 has substantially the same transmission rate for each wavelength component in the visible light region.

Note that the dimmer film 301 may include a film including a color material such as carbon black or titanium black or may include an adhesive or a pressure sensitive agent in which such a color material is kneaded (which contains such a color material) and a film disposed on the adhesive or pressure sensitive agent for bonding or pressure sensitive adhesion.

Additionally, the low-reflection layer 184 is provided on a surface of the dimmer film 301 opposite to the display section 151 side, that is, on the front surface of the display module 82 opposite to the display section 151 side, as is the case with the example illustrated in FIG. 6.

The low-reflection layer 184 may be added to the front surface of the dimmer film 301 by the existing coating or deposition method. Additionally, the low-reflection layer 184 may be formed by laminating, to the front surface of the dimmer film 301, a film subjected to low-reflection processing or the like.

The provision of the dimmer film 301 as described above allows reflection of outside light from the display module 82 to be suppressed, improving the visual quality of images on the display module 82, and more particularly the bright contrast of the images.

That is, the provision of the low-reflection layer 184 on the front surface of the dimmer film 301 enables a reduction in reflection, from the front surface (low-reflection layer 184) of the dimmer film 301, of outside light incident on the dimmer film 301 from outside.

Additionally, outside light incident on the inside of the dimmer film 301 from outside is dimmed by the dimmer film 301, consequently enabling a reduction in the quantity of outside light incident on the dimmer film 301 from outside and that is reflected inside the display section 151 and emitted to the outside of the dimmer film 301.

As described above, the present technology allows the visual quality in the display apparatus, the display unit, and the display module to be improved.

Note that embodiments of the present technology are not limited to the embodiments described above and that various alterations may be made to the embodiments without departing from the spirits of the present technology.

Furthermore, the present technology can also be configured as follows.

(1)

A display module including:

a display section; and a film disposed on the display section to reduce light incident from outside and that is reflected from the display section, in which the display section includes an electronic board and a plurality of LED elements juxtaposed at predetermined intervals on a surface of the electronic board, the surface being on the film side, and a distance from the LED element positioned closest to an end of the display section to the end of the display section is equal to or shorter than half the predetermined interval.

(2)

The display module according to (1), in which a low-reflection layer is provided on a surface of the film opposite to the display section, the low-reflection layer reducing light incident from outside and that is reflected from the surface of the film opposite to the display section.

(3)

The display module according to (1) or (2), in which, in a case where the display module is viewed from a direction perpendicular to a front surface of the display section, a contour of the display section is substantially equal to a contour of the film.

(4)

The display module according to any one of (1) to (3), in which the film includes a circular polarizing film.

(5)

The display module according to (4), in which the circular polarizing film includes at least a quarter wavelength film, a polarizing film, and a protective layer.

(6)

The display module according to (5), in which the polarizing film has a thickness of 10 μm or less.

(7)

The display module according to (5) or (6), in which the protective layer includes COP or PET.

(8)

The display module according to any one of (5) to (7), in which a resin material is applied to a side surface of the display module to cover at least an end portion of the polarizing film on the side surface of the display module.

(9)

The display module according to (8), in which the resin material includes a moisture-proof function.

(10)

The display module according to (8), in which the resin material is applied to the side surface of the display module to cover at least a part of an end portion of the circular polarizing film and an end portion of the display section on the side surface of the display module.

(11)

The display module according to any one of (8) to (10), in which the resin material has a water vapor transmission rate of 100 $g/m^2 \cdot 24$ h under an environment at a temperature of 40° C. and a humidity of 90% RH.

(12)

The display module according to any one of (8) to (11), in which the resin material is blackened.

(13)

The display module according to any one of (8) to (12), in which the resin material includes an edge emitting prevention function.

(14)

The display module according to any one of (1) to (3), in which the film includes a dimmer film.

(15)

The display module according to (14), in which the dimmer film has substantially the same transmission rate for each wavelength component in a visible light region.

(16)

The display module according to any one of (4) to (13), in which the circular polarizing film includes iodine.

(17)

The display module according to any one of (1) to (16), in which the display section includes a planarization layer provided between the electronic board and the film, and the LED element is covered with a resin material forming the planarization layer.

(18)

A display apparatus including:

a plurality of display modules juxtaposed like tiles, in which each of the display modules includes a display section, and a film disposed on the display section to reduce light incident from outside and that is reflected from the display section, and the display section includes an electronic board and a plurality of LED elements juxtaposed at predetermined intervals on a surface of the electronic board, the surface being on the film side, and a distance from the LED element positioned closest to an end of the display section to the end of the display section is equal to or shorter than half the predetermined interval.

(19)

A manufacturing method for a display module including a display section and a film disposed on the display section to reduce light incident from outside and that is reflected from the display section, the method including the steps of:

juxtaposing a plurality of LED elements at predetermined intervals on an electronic board to form the display section including the electronic board and the plurality of the LED elements and in which a distance from the LED element positioned closest to an end of the display section to the end of the display section is equal to or shorter than half the predetermined interval; and disposing the film on a surface of the display section on which the LED elements are disposed.

(20)

The manufacturing method according to (19), further including:

a step of applying a resin material to a side surface of the display module to cover a part of an end of the film on the side surface of the display module.

REFERENCE SIGNS LIST

13: Display apparatus

21-1 to 21-N, 21: Display unit

82-1 to 82-M, 82: Display module

151: Display section

152: Circular polarizing film

161: Electronic board

162: Planarization layer

171-1 to 171-10, 171: LED element

181: Quarter wavelength film

182-1, 182-2, 182: Protective layer

183: Polarizing film

184: Low-reflection layer

231: Resin material

301: Dimmer film

The invention claimed is:

1. A display module, comprising:

a display section;

a film on the display section, wherein the film reduces reflection of light from the display section, and the light is incident on the display module from an outside of the display module;

an electronic board in the display section; and a plurality of Light Emitting Diode (LED) elements on a surface of the electronic board, wherein a first LED element of the plurality of LED elements and a second LED element of the plurality of LED elements are juxtaposed at a specific interval on the surface of the electronic board, the first LED element is adjacent to the second LED element, the surface of the electronic board is on a side of the film, a distance from a third LED element of the plurality of LED elements to an end of the display section is equal to or shorter than half of the specific interval, and a position of the third LED element is closest to the end of the display section among positions of the plurality of LED elements.

2. The display module according to claim 1, further comprising a low-reflection layer on a surface of the film, wherein the surface of the film is opposite to the display section, and the low-reflection layer reduces the reflection of the light from the surface of the film.

3. The display module according to claim 1, wherein, in a case where the display module is viewed from a direction perpendicular to a front surface of the display section, a contour of the display section is substantially equal to a contour of the film.

4. The display module according to claim 1, wherein the film includes a circular polarizing film.

5. The display module according to claim 4, wherein the circular polarizing film includes at least one of a quarter wavelength film, a polarizing film, or a protective layer.

6. The display module according to claim 5, wherein the polarizing film has a thickness of 10 μm or less.

7. The display module according to claim 5, wherein the protective layer includes one of Cyclo Olefin Polymer (COP) or Poly Ethylene Terephthalate (PET).

8. The display module according to claim 5, further comprising a resin material on a side surface of the display module, wherein the resin material covers at least an end portion of the polarizing film on the side surface of the display module.

9. The display module according to claim 8, wherein the resin material includes a moisture-proof function.

10. The display module according to claim 8, wherein the resin material further covers at least a part of an end portion of the circular polarizing film and an end portion of the display section on the side surface of the display module.

11. The display module according to claim 8, wherein the resin material has a water vapor transmission rate of 100 g/m²·24 h under an environment at a temperature of 40° C. and a humidity of 90% RH.

12. The display module according to claim 8, wherein the resin material is blackened.

13. The display module according to claim 8, wherein the resin material includes an edge emitting prevention function.

14. The display module according to claim 1, wherein the film includes a dimmer film.

15. The display module according to claim 4, wherein the circular polarizing film includes iodine.

16. The display module according to claim 14, wherein the dimmer film has a first transmission rate for a first wavelength component in a visible light region substantially same as a second transmission rate for a second wavelength component in the visible light region.

17. The display module according to claim 1, further comprising a planarization layer in the display section, wherein the planarization layer is between the electronic board and the film, the planarization layer includes a resin material, and each of the plurality of LED elements is covered with the resin material of the planarization layer.

18. A display apparatus, comprising:

a plurality of display modules juxtaposed in the display apparatus, wherein each of the plurality of display modules includes:

a display section;

a film on the display section, wherein the film reduces reflection of light from the display section, and the light is incident on a display module of the plurality of display modules from an outside of the display module;

an electronic board in the display section; and a plurality of Light Emitting Diode (LED) elements on a surface of the electronic board, wherein a first LED element of the plurality of LED elements and a second LED element of the plurality of LED elements are juxtaposed at a specific interval on the surface of the electronic board, the first LED element is adjacent to the second LED element, the surface of the electronic board is on a side of the film, a distance from a third LED element of the plurality of LED elements to an end of the display section is equal to or shorter than half of the specific interval, and a position of the third LED element is closest to the end of the display section among positions of the plurality of LED elements.

19. A manufacturing method for a display module, the manufacturing method comprising:

juxtaposing a first LED element of a plurality of Light Emitting Diode (LED) elements and a second LED element of the plurality of LED elements at a specific interval on an electronic board, wherein the first LED element is adjacent to the second LED element;

forming a display section including the electronic board and the plurality of LED elements, wherein a distance from a third LED element of the plurality of LED elements to an end of the display section is equal to or shorter than half of the specific interval, and a position of the third LED element is closest to the end of the display section among positions of the plurality of LED elements; and disposing a film on a surface of the display section, wherein the plurality of LED elements is disposed on the surface of the display section, the film reduces reflection of light from the display section, and the light is incident on the display module from an outside of the display module.

20. The manufacturing method according to claim 19, further comprising:

applying a resin material to a side surface of the display module to cover a part of an end of the film on the side surface of the display module.

\* \* \* \* \*